(12) United States Patent
Nakagaki et al.

(10) Patent No.: US 12,113,332 B2
(45) Date of Patent: Oct. 8, 2024

(54) LIGHT EMITTING DEVICE

(71) Applicant: NICHIA CORPORATION, Anan (JP)

(72) Inventors: Masatoshi Nakagaki, Komatsushima (JP); Soichiro Miura, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/358,019

(22) Filed: Jul. 24, 2023

(65) Prior Publication Data

US 2023/0369824 A1 Nov. 16, 2023

Related U.S. Application Data

(63) Continuation of application No. 17/697,897, filed on Mar. 17, 2022, now Pat. No. 11,784,461, which is a
(Continued)

(30) Foreign Application Priority Data

Jan. 31, 2019 (JP) .................................. 2019-015143
Sep. 13, 2019 (JP) .................................. 2019-166722

(51) Int. Cl.
*H01S 5/02355* (2021.01)
*H01S 5/022* (2021.01)
(Continued)

(52) U.S. Cl.
CPC ............ *H01S 5/0239* (2021.01); *H01S 5/022* (2013.01); *H01S 5/0233* (2021.01);
(Continued)

(58) Field of Classification Search
CPC ...... H01S 5/0239; H01S 5/022; H01S 5/0233; H01S 5/02355; H01S 5/40; H01S 5/4031; H01S 5/02345; H01S 5/0235; H01S 5/023

See application file for complete search history.

(56) References Cited

U.S. PATENT DOCUMENTS

| 2002/0172245 A1 | 11/2002 | Nakatsuka et al. |
| 2006/0251138 A1 | 11/2006 | Hata et al. |
| (Continued) | | |

FOREIGN PATENT DOCUMENTS

| CN | 102142659 A | 8/2011 |
| CN | 107431329 A | 12/2017 |
| (Continued) | | |

OTHER PUBLICATIONS

Non-Final Office Action in the related U.S. Appl. No. 17/697,897, dated Jan. 12, 2023.

*Primary Examiner* — Yuanda Zhang
(74) *Attorney, Agent, or Firm* — Global IP Counselors, LLP

(57) ABSTRACT

A light emitting device includes first and second semiconductor laser elements, first and second light-reflective members, and a basal part. The light emitted from the first semiconductor laser element irradiates a first light-reflective surface of the first light-reflective member at a first position. The light emitted from the second semiconductor laser element irradiates a second light-reflective surface of the second light-reflective member at a second position. A height of the first position is different from a height of the second position. With respect to a virtual axis extending along the prescribed direction, the first position and the second position have the same coordinates. A mounting position of the first light-reflective member and a mounting position of the second light-reflective member are different with respect to the prescribed direction.

8 Claims, 15 Drawing Sheets

Related U.S. Application Data continuation of application No. 16/774,516, filed on Jan. 28, 2020, now Pat. No. 11,309,681.

(51) Int. Cl.
  *H01S 5/0233* (2021.01)
  *H01S 5/0239* (2021.01)
  *H01S 5/40* (2006.01)
  *H01S 5/02345* (2021.01)

(52) U.S. Cl.
  CPC ............ *H01S 5/02355* (2021.01); *H01S 5/40* (2013.01); *H01S 5/4031* (2013.01); *H01S 5/02345* (2021.01)

(56) References Cited

U.S. PATENT DOCUMENTS

| | | |
|---|---|---|
| 2008/0310471 A1 | 12/2008 | Bessho et al. |
| 2010/0302775 A1 | 12/2010 | Hata |
| 2011/0064111 A1 | 3/2011 | Tanikawa |
| 2012/0027040 A1 | 2/2012 | Hata et al. |
| 2012/0106584 A1 | 5/2012 | Katsuki et al. |
| 2013/0265770 A1* | 10/2013 | Breidenassel ....... H01S 5/02253 |
| | | 362/296.01 |
| 2017/0122505 A1 | 5/2017 | Kiyota et al. |
| 2018/0097335 A1 | 4/2018 | Breidenassei et al. |
| 2018/0269650 A1 | 9/2018 | Nozaki |

FOREIGN PATENT DOCUMENTS

| | | |
|---|---|---|
| DE | 10 2015 105807 A1 | 10/2016 |
| JP | 2002344061 A | 11/2002 |
| JP | 2006-269987 A | 10/2006 |
| JP | 2009027149 A | 2/2009 |
| JP | 2011066064 A | 3/2011 |
| JP | 2012094765 A | 5/2012 |
| JP | 2012186308 A | 9/2012 |
| JP | 2013016585 A | 1/2013 |
| JP | 2013031905 A | 2/2013 |
| JP | 2017-085036 A | 5/2017 |
| WO | 2017098689 A1 | 6/2017 |

* cited by examiner

LIGHT EMITTING DEVICE

CROSS-REFERENCE TO RELATED APPLICATION

This application is a continuation application of U.S. patent application Ser. No. 17/697,897 filed on Mar. 17, 2022, which is a continuation application of U.S. patent application Ser. No. 16/774,516 filed on Jan. 28, 2020, now U.S. Pat. No. 11,309,681. This application claims priority to Japanese Patent Application No. 2019-015143 filed on Jan. 31, 2019, and Japanese Patent Application No. 2019-166722 filed on Sep. 13, 2019. The entire disclosures of U.S. patent application Ser. Nos. 17/697,897 and 16/774,516, and Japanese Patent Application Nos. 2019-015143 and 2019-166722 are hereby incorporated herein by reference.

BACKGROUND

The present disclosure relates to a light emitting device including a mount member.

As disclosed in Japanese Patent Publication No. 2011-066064, there is a known semiconductor laser device in which a plurality of semiconductor laser elements is mounted on one submount. The submount has a region on which the semiconductor laser elements are mounted and a wiring part where wires are bonded.

As disclosed in Japanese Patent Publication No. 2011-066064, mounting a plurality of light emitting elements on one mount member can be advantageous to size reduction in the light emitting device, condensing light, or simplifying mounting procedure. However, in mounting a plurality of light emitting elements on one mount member, there is still room for improvement of the wiring pattern or the bonding manner.

SUMMARY

A light emitting device according to one aspect includes a first semiconductor laser element, a second semiconductor laser element, a first light-reflective member, a second light-reflective member, and a basal part. The first semiconductor laser element is configured to emit light in a prescribed direction. The second semiconductor laser element is configured to emit light in the prescribed direction. The first light-reflective member is spaced apart from the first semiconductor laser element in the prescribed direction. The first light-reflective member has a first lower surface and a first light-reflective surface inclined relative to the first lower surface. The first light-reflective surface is configured to reflect the light emitted from the first light-reflective member. The second light-reflective member is spaced apart from the second semiconductor laser element in the prescribed direction. The second light-reflective member has a second lower surface and a second light-reflective surface inclined relative to the second lower surface. The second light-reflective surface is configured to reflect the light emitted from the second light-reflective member. The basal part has a bottom surface over which the first semiconductor laser element, the second semiconductor laser element, the first light-reflective member and the second light-reflective member are disposed. The first lower surface of the first light-reflective member faces the bottom surface of the basal part. The second lower surface of the second light-reflective member faces the bottom surface of the basal part. The light emitted from the first semiconductor laser element and traveling along an optical axis irradiates the first light-reflective surface at a first position. The light emitted from the second semiconductor laser element and traveling along an optical axis irradiates the second light-reflective surface at a second position. A height from the first lower surface of the first light-reflective member to the first position on the first light-reflective surface is different from a height from the second lower surface of the second light-reflective member to the second position on the second light-reflective surface as measured along a direction perpendicular to the bottom surface of the basal part. With respect to a virtual axis extending along the prescribed direction, the first position on the first light-reflective surface and the second position on the second light-reflective surface have the same coordinates. A mounting position of the first light-reflective member and a mounting position of the second light-reflective member are different with respect to the prescribed direction so that the first position on the first light-reflective surface and the second position on the second light-reflective surface have the same coordinates with respect to the virtual axis.

A light emitting device according to another aspect includes a first semiconductor laser element, a second semiconductor laser element, a first light-reflective member, a second light-reflective member, and a basal part. The first semiconductor laser element is configured to emit light in a prescribed direction. The second semiconductor laser element is configured to emit light in the prescribed direction. The first light-reflective member is spaced apart from the first semiconductor laser element in the prescribed direction. The first light-reflective member has a first lower surface and a first light-reflective surface inclined relative to the first lower surface. The first light-reflective surface is configured to reflect the light emitted from the first light-reflective member. The second light-reflective member is spaced apart from the second semiconductor laser element in the prescribed direction. The second light-reflective member has a second lower surface and a second light-reflective surface inclined relative to the second lower surface. The second light-reflective surface is configured to reflect the light emitted from the second light-reflective member. The basal part has a bottom surface over which the first semiconductor laser element, the second semiconductor laser element, the first light-reflective member and the second light-reflective member are disposed. The first lower surface of the first light-reflective member faces the bottom surface of the basal part. The second lower surface of the second light-reflective member faces the bottom surface of the basal part. The light emitted from the first semiconductor laser element and traveling along an optical axis irradiates the first light-reflective surface at a first position. The light emitted from the second semiconductor laser element and traveling along an optical axis irradiates the second light-reflective surface at a second position. A height from the first lower surface of the first light-reflective member to the first position on the first light-reflective surface is different from a height from the second lower surface of the second light-reflective member to the second position on the second light-reflective surface as measured along a direction perpendicular to the bottom surface of the basal part. With respect to the prescribed direction, a difference between the first position and the second position is smaller than a difference between a mounting position of the first light-reflective member and a mounting position of the second light-reflective member.

DESCRIPTION

Figure 1:
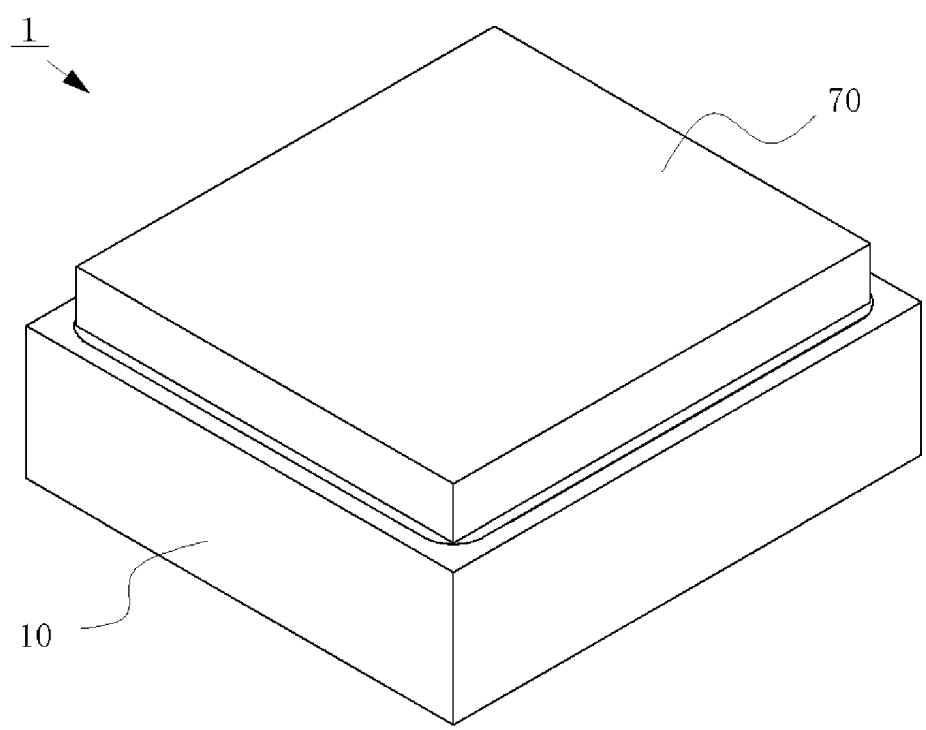
FIG. 1 is a perspective view of a light emitting device according to a first embodiment.

In the description and the scope of claims, the terms referring to any polygon such as a triangle, a quadrangle and the like include polygons having their corners rounded, chamfered, beveled, or round off. Without being limited to the corners (ends of sides), any polygon having its side deformed at an intermediate portion is also referred to as a polygon. That is, any shape obtained by deforming a polygon is construed as "a polygon" recited in the description and the scope of claims.

Without being limited to polygons, the same holds true for terms referring to a particular shape such as a trapezoid, a circle, or a recess or a projection. The foregoing also applies to each side forming such a shape. That is, a side which is deformed at its end or intermediate portion is still construed as "a side". Note that, "a polygon" or "a side" without any intended deformation is referred to with the term "exact", such as "an exact quadrangle", when distinguished from any intentionally deformed shape.

In the description and the scope of claims, when a plurality of elements correspond to a certain constituent and are to be distinguished from each other, the term of such elements may be preceded by the word "first" or "second". When the target of distinction or the concept in distinction is different between the description and the scope of claims, such preceding words may be organized in different manners between the description and the scope of claims.

In the following, with reference to the drawings, a description will be given of embodiments for carrying out the present disclosure. While the embodiments embody the technical idea of the present disclosure, they are not intended to limit the present disclosure. In the following description, identical names and reference numerals are assigned to identical or similar members, and any repetitive description may be avoided as appropriate. The size or positional relationship of members in the drawings may be exaggerated for the sake of clarity.

First Embodiment

Figure 2:
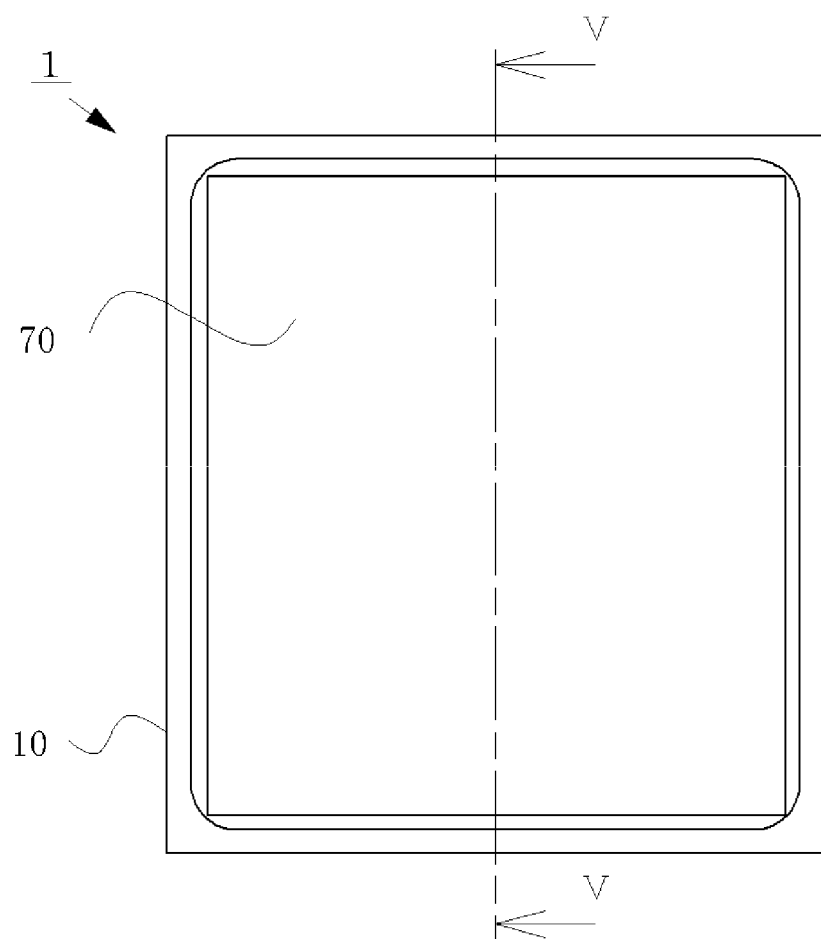
FIG. 2 is a top view of the light emitting device according to the first embodiment.
Figure 3:
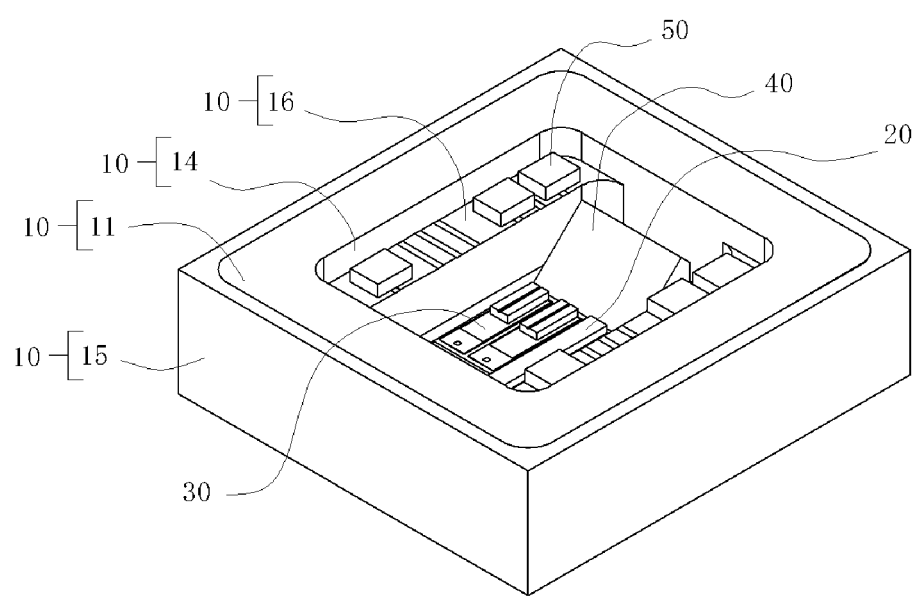
FIG. 3 is a perspective view for illustrating the constituents of the light emitting device according to the first embodiment.
Figure 4:
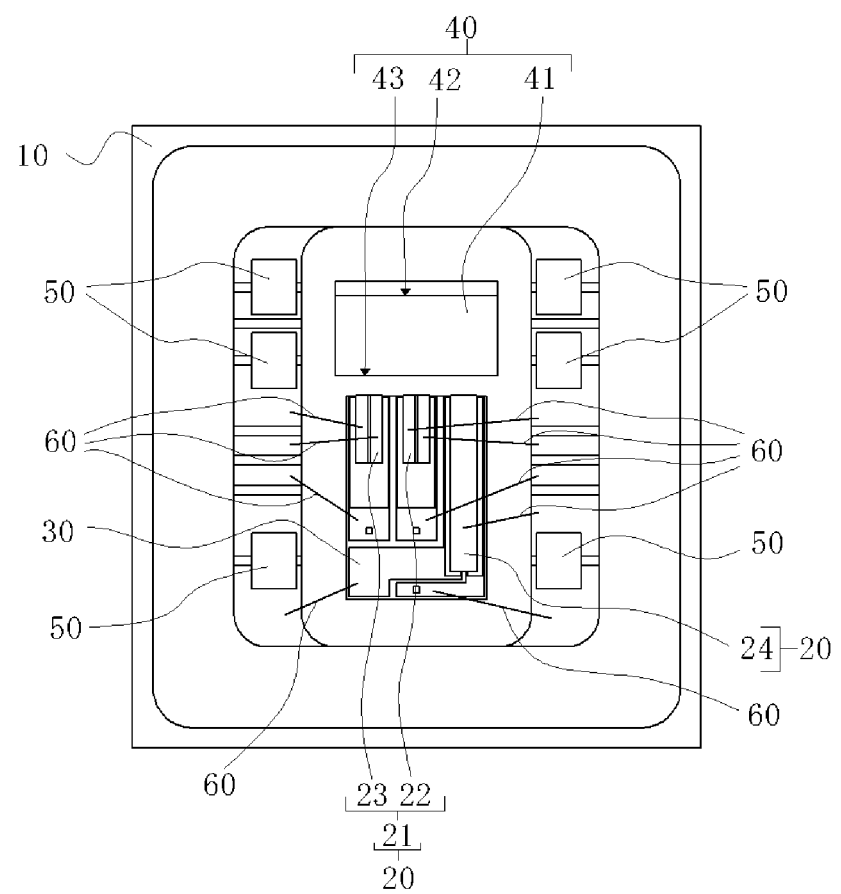
FIG. 4 is a top view for illustrating the constituents of the light emitting device according to the first embodiment.
Figure 5:
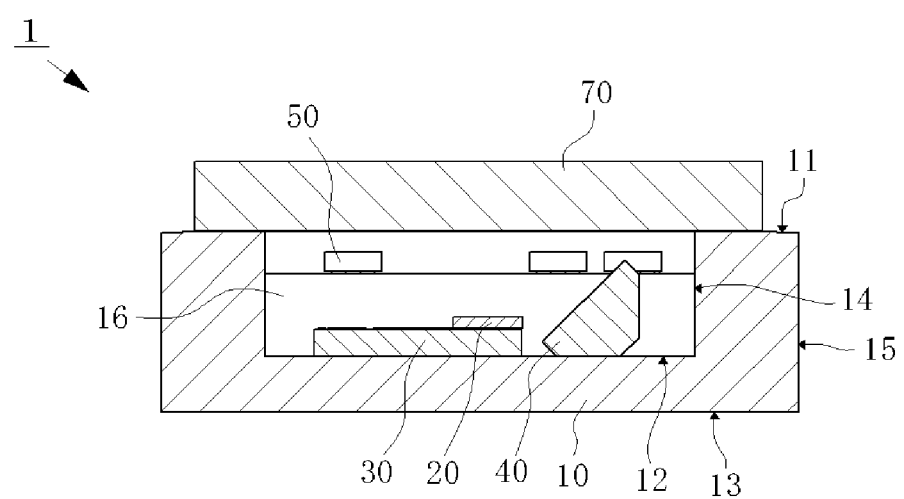
FIG. 5 is a cross-sectional view of the light emitting device taken along line V-V in FIG. 2.
Figure 6:
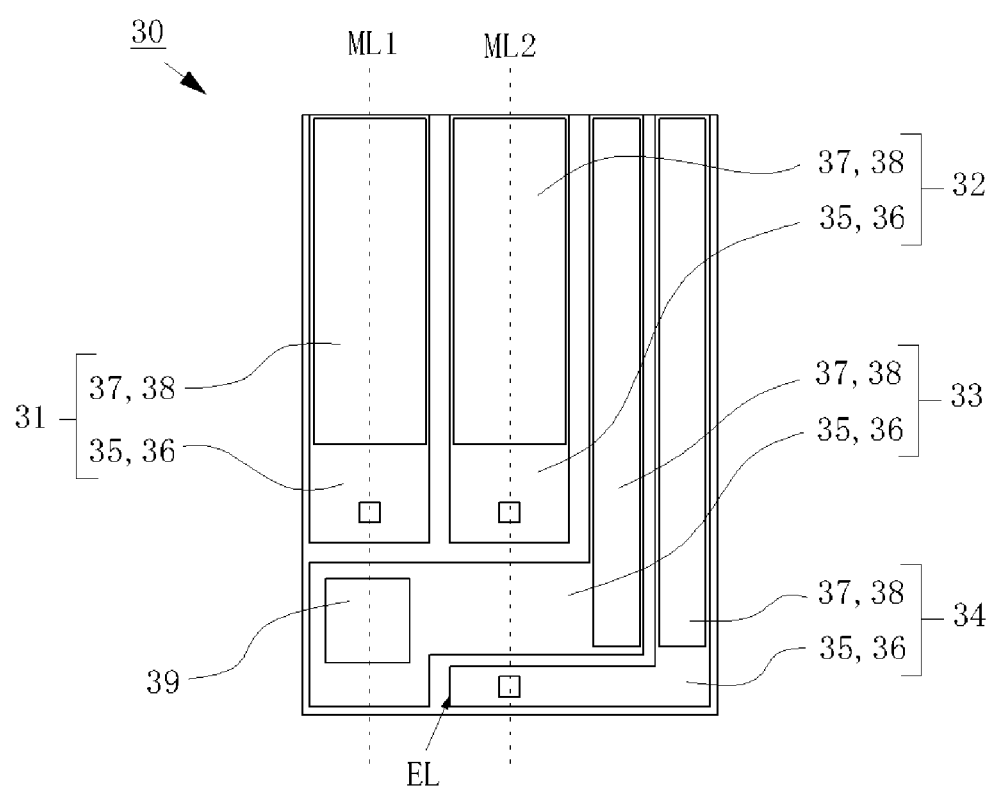
FIG. 6 is a top view of a submount of the light emitting device according to the first embodiment.
Figure 7:
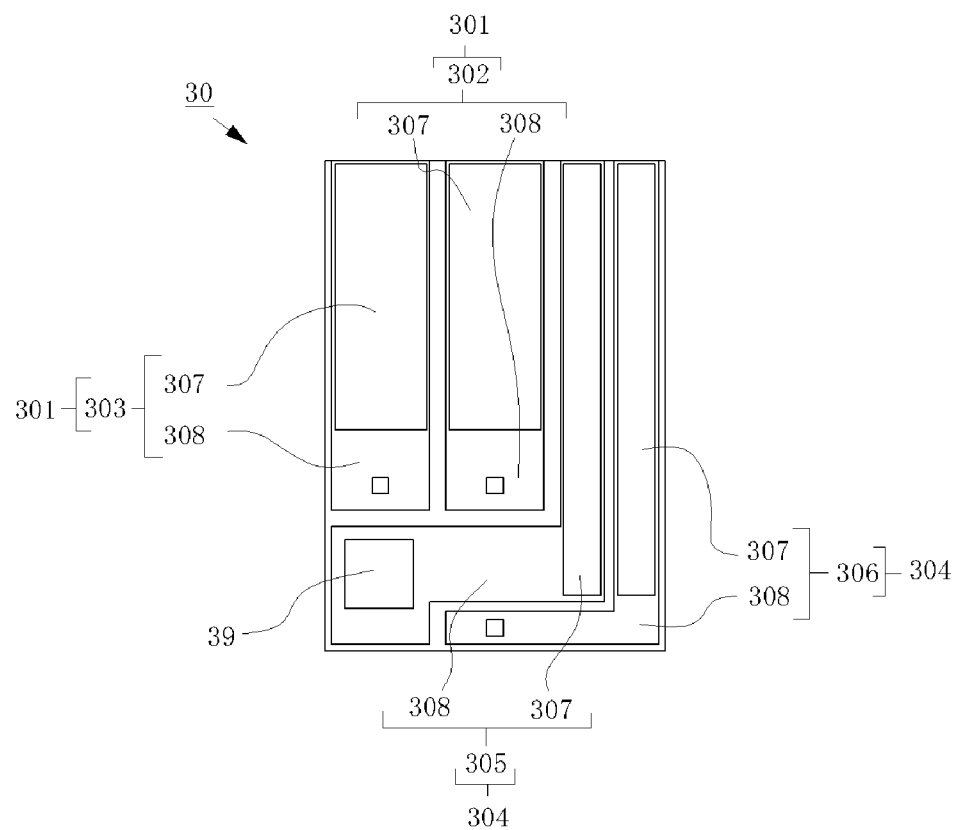
FIG. 7 is a top view of the submount of the light emitting device according to the first embodiment.
Figure 8:
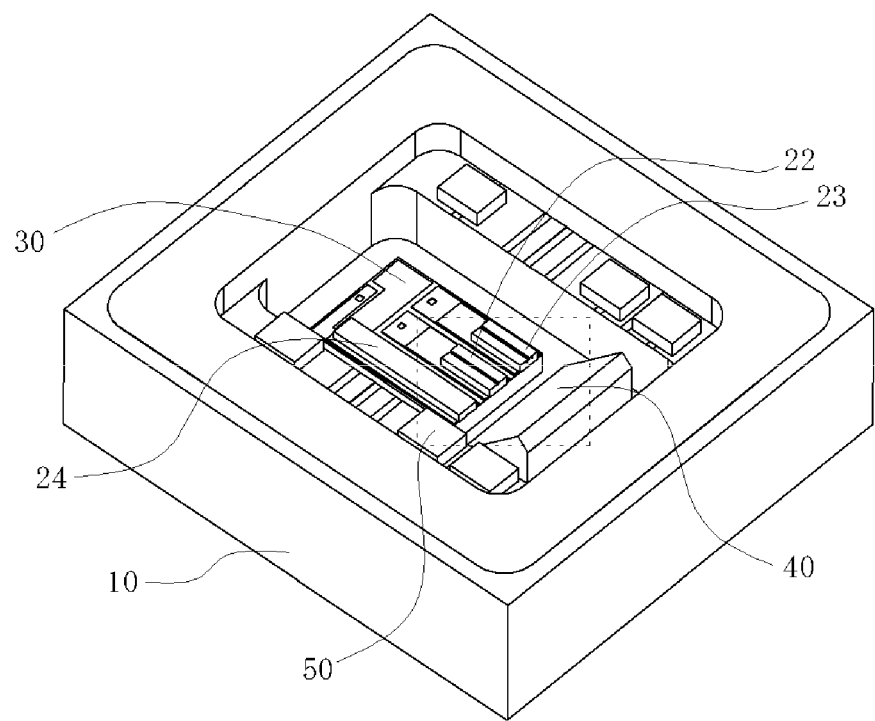
FIG. 8 is a perspective view for illustrating the constituent elements of the light emitting device according to the first embodiment.
Figure 9:
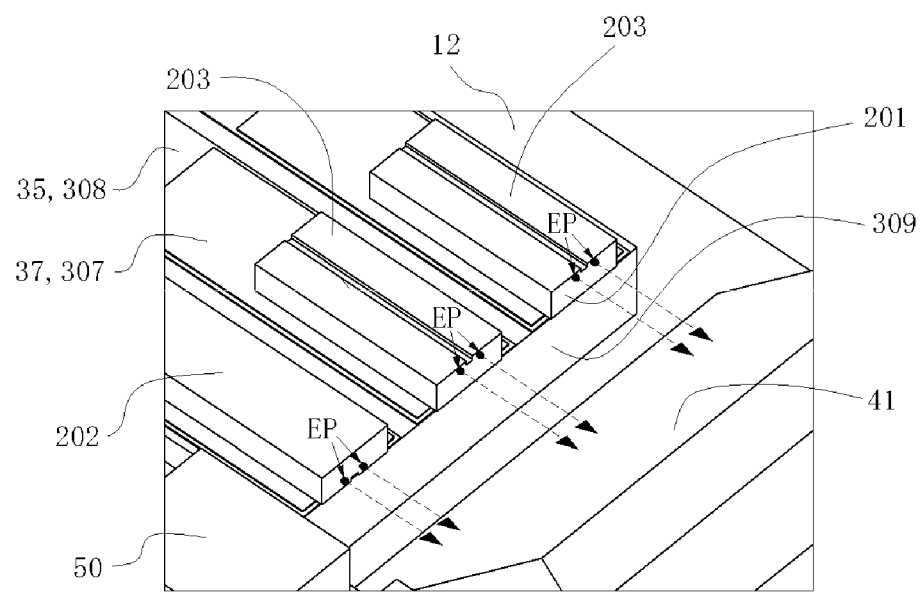
FIG. 9 is an enlarged view showing within the broken-line frame in FIG. 8 of the light emitting device according to the first embodiment.
Figure 10:
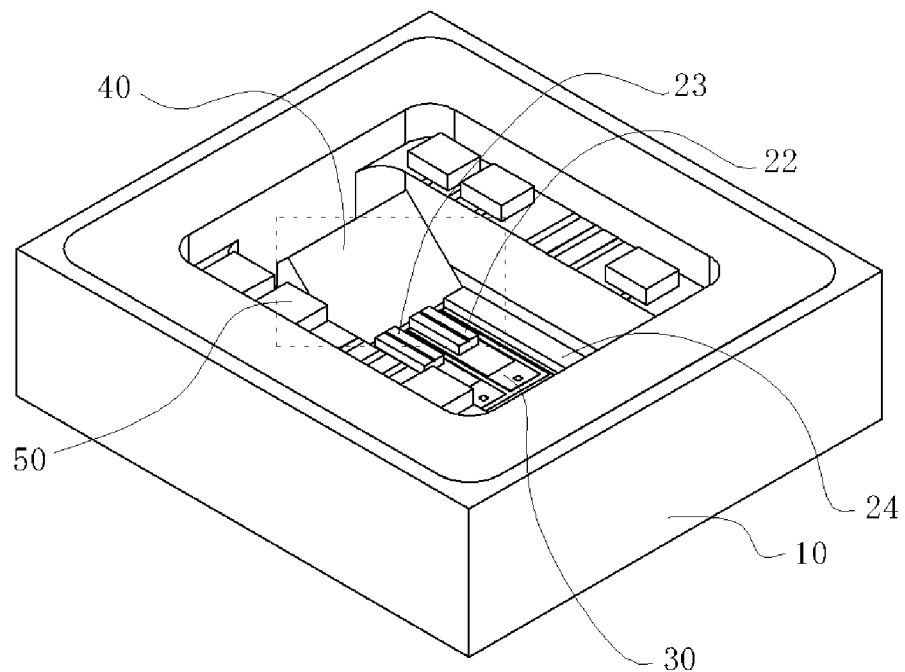
FIG. 10 is a perspective view for illustrating the constituent elements of the light emitting device according to the first embodiment.
Figure 11:
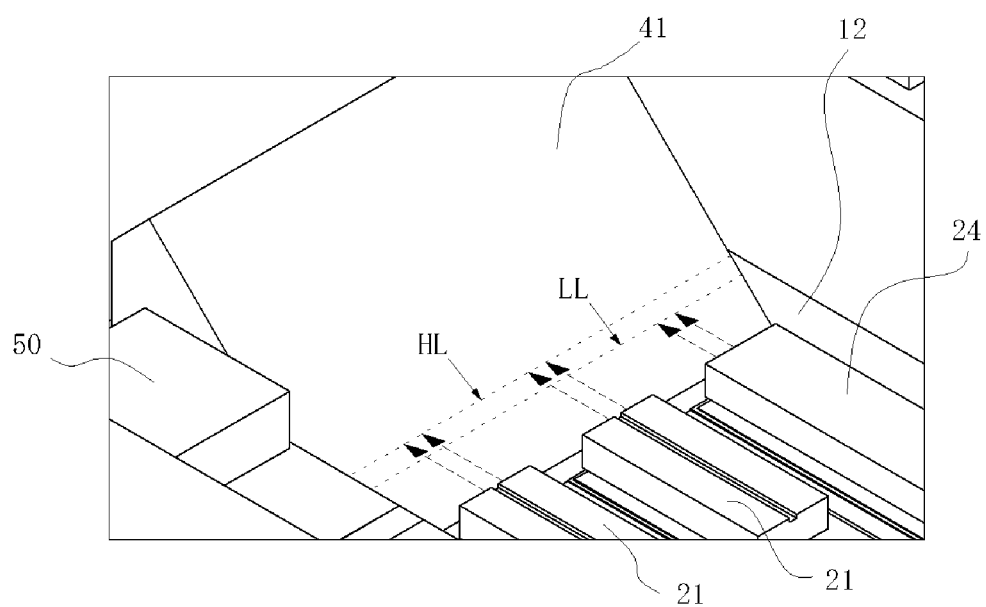
FIG. 11 is an enlarged view showing within the broken-line frame in FIG. 10 of the light emitting device according to the first embodiment.
Figure 12:
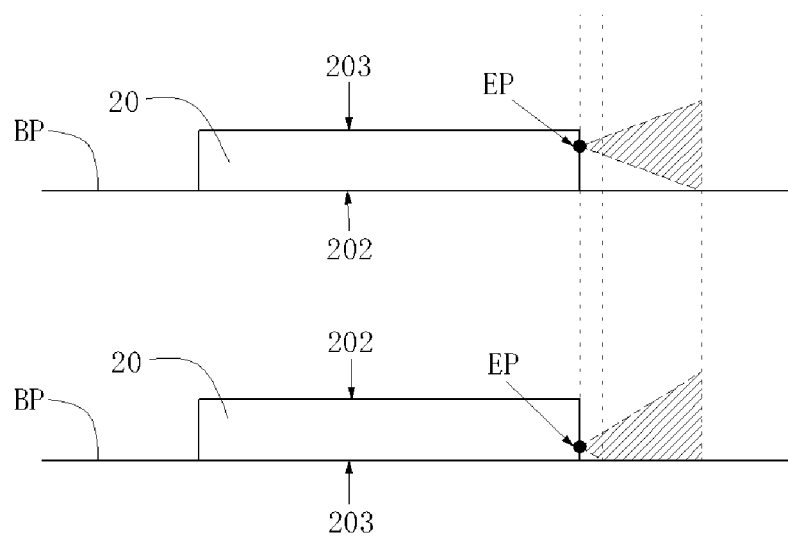
FIG. 12 is a schematic illustration comparing between lights emitted from semiconductor laser elements having emission positions different from each other.

FIG. 1 is a perspective view of a light emitting device 1 according to a first embodiment. FIG. 2 is a top view of the light emitting device 1 shown in FIG. 1. FIG. 3 is a perspective view for illustrating constituents of the light emitting device 1, excluding the lid member 70. FIG. 4 is a top view of the light emitting device 1 shown in FIG. 3. FIG. 5 is a cross-sectional view of the light emitting device 1 taken along line V-V in FIG. 2. FIG. 6 is a top view of a submount 30 of the light emitting device 1. FIG. 7 is a top view of the submount for illustrating the relationship between the mounted semiconductor laser elements and the submount 30 in relation to the light emitting device 1. FIGS. 8 and 10 are each a perspective view of the light emitting device 1 with a broken-line frame defining a region to be enlarged. FIGS. 9 and 11 are respectively enlarged views of the region in FIG. 8 and a region in FIG. 10. FIG. 12 is a schematic illustration for comparing lights emitted from the semiconductor elements having emission positions different from each other. In order to avoid complexity, the wires shown in FIG. 4 are not shown in other drawings.

The light emitting device 1 includes a basal part 10, three semiconductor laser elements 20, a submount 30, a light-reflective member 40, six protective elements 50, nine wires 60, and a lid member 70, as its constituents.

The basal part 10 has a quadrangular outer shape as seen in a top view, and has a recessed shape inward of the outer shape. The recessed shape has a recess part depressed from the upper surface toward the lower surface. The basal part 10 includes an upper surface 11, a bottom surface 12, a lower surface 13, inner lateral surfaces 14, and outer lateral surfaces 15. The basal part 10 includes step parts 16 each consisting of an upper surface and a lateral surface in the recess part.

The upper surface 11 meets the inner lateral surfaces 14 and the outer lateral surfaces 15. The lower surface 13 meets the outer lateral surfaces 15. The bottom surface 12 is an upper surface positioned higher than the lower surface 13 and lower than the upper surface 11, and is the bottom of the recess. The bottom surface 12 meets the lateral surface of each step part 16 in the regions where the step parts 16 are formed, and meets the inner lateral surfaces 14 in the regions where the step parts 16 are not formed. The upper surface of each step part 16 meets the inner lateral surfaces 14.

The recess part defines space inward of the frame formed by the upper surface 11. The outer shape of the frame is quadrangular. The step parts 16 are formed inward of the quadrangular frame. The step parts 16 are respectively provided along two inner lateral surfaces 14 corresponding to the opposing two sides of the quadrangle, over the entire length of each inner lateral surface 14.

On the inner lateral surfaces 14 corresponding to other two opposing sides, the step parts 16 are not provided except for the intersecting portions. As used herein, the intersecting portion refers to the portion where a lateral surface and a lateral surface intersect with each other by their ends. The region where the step part 16 is to be provided is not limited to those. The step part 16 can be provided only one inner lateral surface 14 corresponding to one side among the two opposing sides. The step part 16 can be provided on the inner lateral surface 14 corresponding to at least one of the above-described other two opposite sides.

The main material of the basal part 10 can be ceramic. Ceramic used for the basal part 10 can be, for example, aluminum nitride, silicon nitride, aluminum oxide, or silicon carbide.

A plurality of metal films (seventh metal films and eighth metal films) is provided on each of the lower surface 13 of the basal part 10 and the upper surfaces of the step parts 16. The metal films on the lower surface 13 side and the metal films on the upper surface side of the step part 16 are connected to each other via metal passing inside the basal part 10 and, therefore, can be electrically connected to each other. The metal films can be disposed on other region in the basal part 10. For example, metal films can be provided on the bottom surface 12 instead of the upper surface of the step part 16, and metal films can be provided on the upper surface 11 or the outer lateral surface(s) 15 of the basal part 10 instead of the lower surface 13.

In the basal part 10, the bottom part including the bottom surface 12 and the frame part, which includes the inner lateral surfaces 14 and the step parts 16 and forms a frame surrounding the bottom part, can be formed of different main materials, and the basal part 10 can be formed by joining the bottom part and the frame part to each other. For example, in the basal part 10, the main material of the frame part can be ceramic, and the main material of the bottom part can be metal which is higher in thermal conductivity than ceramic.

The outer shape of the semiconductor laser element 20 is rectangular which has a short sides and long sides as seen in a top view or a bottom view. A lateral surface intersecting with one of two short sides of the rectangle functions as a light-emission end surface 201 of the semiconductor laser element 20 (see FIG. 9). The upper surface and the lower surface of the semiconductor laser element 20 are greater in area than the light-emission end surface 201.

The three semiconductor laser elements 20 are each a multiple-emitter element including two emitters. At the upper surface and the lower surface of the semiconductor laser element 20, one electrode surface shared by two emitters is provided to one surface (i.e., a first surface 202), and two electrode surfaces respectively corresponding to the two emitters are provided to other surface (i.e., a second surface 203 opposite to the first surface 202). The electrode surface of the first surface 202 is the cathode electrode, and the two electrode surfaces of the second surface 203 are anode electrodes.

In the second surface 203, two ridges extending in the longitudinal direction of the rectangle are next to each other, and the electrode surface corresponding to one emitter is provided for each ridge. Accordingly, in the second surface 203, one groove extending in the longitudinal direction is formed to be the boundary between the two ridges.

The semiconductor laser element 20 includes two emitters and, therefore, there are two emission positions EP where lights are each emitted in the light emission end surface 201 (see FIG. 9). In the semiconductor laser element 20, these two emission positions EP are both closer to the second surface 203 than to the first surface 202.

Laser light emitted from each emitter spreads, and forms an oval far-field pattern (hereinafter referred to as "the FFP") in a plane parallel to the light emission end surface 201. The FFP is the shape of emitted light or light intensity distribution at a position away from the light emission end surface.

As used herein, light emitted from the light emission end surface and passing through the center of the oval shape of the FFP are referred to as light of the optical axis. The full width at half maximum of the peak intensity value in a light intensity distribution is referred to as the divergence of the laser light. The divergence in the major-axis direction of the oval shape of the FFP is referred to as the vertical-direction divergence, and the divergence in the minor-axis direction is referred to as the lateral-direction divergence.

In relation to the vertical-direction divergence, one of the three semiconductor laser elements 20 is greater than other two semiconductor laser elements in divergence by at least 3 degrees. This angle difference can be less than 3 degrees, or there is no angle difference. All the three semiconductor laser elements 20 provide sufficiently small lateral-direction divergence relative to the vertical-direction divergence. For example, the lateral-direction divergence is half or less as great as the vertical-direction divergence.

The three semiconductor laser elements 20 consist of a semiconductor laser element emitting blue-color light, a semiconductor laser element emitting green-color light, and a semiconductor laser element emitting red-color light. In the light emitting device 1, vertical-direction divergence of the semiconductor laser element emitting red-color light is greater than that of other semiconductor laser elements by at least 3 degrees.

As used herein, the blue-color light refers to light of which peak emission wavelength is in a range of 420 nm to 494 nm. The green-color light refers to light of which peak emission wavelength is in a range of 495 nm to 570 nm. The red-color light refers to light of which peak emission wavelength is in a range of 605 nm to 750 nm. The light emitting device 1 can employ semiconductor laser elements emitting other color(s) of light. Also, a plurality of semiconductor laser elements emitting an identical color of light can be employed.

The semiconductor laser element emitting blue-color light or green-color light can be a semiconductor laser element containing a nitride semiconductor. The nitride semiconductor can be, for example, GaN, InGaN, and AlGaN. The semiconductor laser element emitting red-color light can contain, for example, an InAlGaP-based, GaInP-based, GaAs-based, or AlGaAs-based semiconductor.

In the outer shape as seen in a top view, the long sides of each two semiconductor laser elements out of the three semiconductor laser elements 20 are the same length. As used herein, the "same length" allows a difference of 20%. The length of other one semiconductor laser element is greater than those of the two semiconductor laser elements in the outer shape as seen in a top view of. Specifically, the length of the other one is greater by more than 20%.

Without being limited to the above-described values, so long as one semiconductor laser element can be regarded as substantially relatively long, the one semiconductor laser element can be regarded as longer than the two semiconductor laser elements. For example, when the difference in long sides between the two semiconductor laser elements is smaller than the difference in long sides between the longer one of these two semiconductor laser elements and the other one semiconductor laser element, the other one semiconductor laser element can be regarded as substantially longer.

Alternatively, in relation also to the configuration of the submount 30 which will be described later, when the other one semiconductor laser element is longer than both of the two semiconductor laser elements by the length of the region allotted to wiring region, the other one semiconductor laser element can be regarded as substantially longer.

For the two semiconductor laser elements, for example, a length of 300 μm is allotted for the wiring region. Alternatively, taking into consideration of the other one semiconductor laser element, for example, a length of 450 μm is allotted for the wiring region. Therefore, with respect to the length of the long side in the outer shape as seen in a top view, when the other one semiconductor laser element is greater than both of the two semiconductor laser elements by 300 μm or more, or 450 μm or more, the other one semiconductor laser element can be regarded as substantially longer.

In the light emitting device 1, with respect to the outer shape as seen in a top view, the longest-side length of the semiconductor laser element is greater than the long-side length of other semiconductor laser elements by twice or more, or by 500 μm or more.

The same holds true even if "the long-side length" is replaced as "the length in the direction perpendicular to the light emission end surface". In the light emitting device 1, the semiconductor laser element emitting red-color light is longer than the semiconductor laser element emitting blue-color light or green-color light.

By adjusting the long-side length, light output (i.e., light emission intensity) can be adjusted. The long-side length necessary to obtain the required output also depends on the light emission efficiency. Accordingly, the long-side length can be designed according to the color or output of emitted light demanded of the semiconductor laser elements. Therefore, the light emitting device 1 employs semiconductor laser elements having different long-side length from each other.

In the following description, when it is desired to distinguish between the two semiconductor laser elements with shorter long-side length and one semiconductor laser element with longer long-side length, the two shorter semiconductor laser elements are referred to as the first semiconductor laser elements 21, and the one longer semiconductor laser element is referred to as the second semiconductor laser element 24. Alternatively, the one longer semiconductor laser element can be an example of the first semiconductor laser element, and the two shorter semiconductor laser elements can be examples of the second and third semiconductor laser elements.

The semiconductor laser element 20 can be a single-emitter element including one emitter. The semiconductor laser elements 20 can include both of a single-emitter element and a multiple-emitter element. The number of the plurality of semiconductor laser elements is not limited to three, and can be, for example, two or four.

The submount 30 has rectangular parallelepiped shape. In the submount 30, the sides in the height direction are the smallest. The upper surface and the lower surface perpendicular to the height direction each have a quadrangular outer shape. The upper surface and the lower surface are parallel to each other. As used herein, being "parallel" allows a difference of 5 degrees or less. The submount 30 does not necessarily have a quadrangular outer shape or a rectangular parallelepiped shape.

The rectangular parallelepiped shape which is the outline of the submount 30 is formed by using an insulating material as a main material. On the upper surface of the outline of the submount 30, metal films are respectively provided to a plurality of regions. The plurality of metal films is not connected to each other. That is, as seen in a top view, the metal films are separated by an insulating material.

Specifically, the submount 30 includes four metal films. The four metal films are arranged such that their ends are aligned in the vicinity of one side of the upper surface of the submount 30 (see FIG. 6). As used herein, being "aligned" refers to being the same in distance. That is, the four metal films are provided at a certain distance from one side of the upper surface of the submount 30. The number of the metal films is not limited to four.

In the following description, when it is desired to distinguish the metal films can be distinguished from one another by referring a first metal film 31, a second metal film 32, a third metal film 33, and a fourth metal film 34 from the left in sequence in the upper side in FIG. 6.

The metal films are in a layered structure. On a lower metal layer 35, an upper metal layer 37 is formed. The upper metal layer 37 is partially formed at the region where the lower metal layer 35 is formed. Therefore, the metal films each include a lower layer film region 36 where the lower metal layer 35 is exposed as seen in a top view, and an upper layer film region 38 where the upper metal layer 37 is exposed as seen in a top view. The outer shape of the lower layer film region 36 is also the outer shape of the corresponding metal film. The metal films are not necessarily in such a layered structure.

The first metal film 31 and the second metal film 32 have the same outer shape and the same size as seen in a top view. Their outer shape is a rectangle. The upper layer film regions 38 have the same outer shape and the same size between the first metal film 31 and the second metal film 32 as seen in a top view. Their outer shape is a rectangle which is smaller than the lower metal layer 35. As used herein, the "same size" allows a difference in area of 20% or less.

Although the third metal film 33 and the fourth metal film 34 are polygons being different from each other in outer shape as seen in a top view, they are similar to each other in that their outer shapes include an L-shape structure. The upper layer film regions 38 have the same outer shape and the same size between the third metal film 33 and the fourth metal film 34. Their outer shape is a rectangle. As used herein, the "same size" allows a difference in area of 20% or less.

In each of the first metal film 31 to the fourth metal film 34, the long sides of the rectangle forming the upper layer film region 38 are parallel to each other. Therefore, the short sides are also parallel to each other. As used herein, being "parallel" allows a difference of 3 degrees. Hereinafter, in description of the submount 30, the longitudinal direction and the width direction respectively refer to the longitudinal direction and the width direction of the rectangle.

In relation to the length in the width direction, the upper layer film region 38 of the first metal film 31 or the second metal film 32 is greater than the upper layer film region 38 of the third metal film 33 or the fourth metal film 34. Specifically, for example, the former is greater than the latter by at least twice. In relation to the length in the longitudinal direction, the upper layer film region 38 of the third metal film 33 or the fourth metal film 34 is greater than the upper layer film region 38 of the first metal film 31 or the second metal film 32. Specifically, the former is greater than the latter by more than 20%.

In relation to the length in the longitudinal direction, the length of the upper layer film region 38 of the third metal film 33 or the fourth metal film 34 is greater than the first metal film 31 or the second metal film 32.

The L-shape structure of the third metal film 33 is formed of one side extending in the longitudinal direction, and one side extending in the width direction from a portion extending further than the first metal film 31 or the second metal film 32 in the longitudinal direction. The side extending in the width direction extends in the direction by which the distance from the first metal film 31 and/or the second metal film 32 does not increases. In the example shown in FIG. 6, the L-shape structure is a laterally flipped L shape.

The L-shape structure of the fourth metal film 34 is formed of one side extending in the longitudinal direction, and one side extending in the width direction from a portion extending further than the first metal film 31, the second metal film 32, and/or the upper layer film region 38 of the third metal film 33. One side extending in the width direction extends in the direction by which the distance from the first metal film 31 or the second metal film 32 does not increase.

Accordingly, the third metal film 33 or the fourth metal film 34 extends in the identical direction from a portion extending further than the first metal film 31 or the second metal film 32 in the longitudinal direction. Thus, the upper surface of the submount 30 can be formed with a simple shape such as a quadrangle, and its outer shape can be small.

The length of the third metal film 33 extending in the width direction does not extend further than the first metal film 31 in the width direction. This can achieve the small outer shape of the submount 30. The third metal film 33 extends in the width direction further than an end FT of one side extending in the width direction of the fourth metal film 34 (see FIG. 6). In relation to the length extending in the width direction, the third metal film 33 is longer than the fourth metal film 34.

The third metal film 33 extends in the longitudinal direction at a portion extending further than the end EL of one side extending in the width direction of the fourth metal film 34. The extending direction in the longitudinal direction of the fourth metal film 34 is the direction by which the distance from the first metal film 31 or the second metal film 32 increases. The length of the extension in the longitudinal direction does not exceed the length of the fourth metal film 34 in the longitudinal direction. Similarly, this can achieve the small outer shape of the submount 30.

The third metal film 33 forms an L-shape structure by one side extending in the width direction and one side extending in the longitudinal direction by which the distance from the first metal film 31 or the second metal film 32 increases. Accordingly, the third metal film 33 can be regarded as having two L-shape structures which share one side. The two L-shape structures respectively have one sides which extend oppositely in terms of longitudinal direction from one shared side.

In the third metal film 33, an information appending region 39 for appending management information in the lower layer film region 36. The management information is information for managing the light emitting device 1 and its constituent elements such as identification information uniquely identifying the light emitting device 1, or identification information identifying the light emitting device 1 per each lot. The management information is provided as, for example, a two-dimensional code.

The management information is not limited to those noted above. For example, address information can be input as a two-dimensional code to enable browsing the product manual or help information by accessing the address through internet. That is, the management information can be information for indirectly tagging the light emitting device 1 to product information.

In order to provide the information appending region 39, the third metal film 33 is greater in area than the fourth metal film 34. The lower layer film region 36 of the third metal film 33 is greater in area than the lower layer film region 36 of the fourth metal film 34. In relation to the width in the longitudinal direction of one side extending in the width direction, the lower layer film region 36 of the third metal film 33 is greater than the lower layer film region 36 of the fourth metal film 34.

The information appending region 39 is provided in a part of the third metal film 33 extending further than the end EL of one side extending in the width direction of the fourth metal film 34. In this extending portion, the information appending region 39 reaches a region where the lower layer film region 36 extends in the longitudinal direction. That is, the region allotted to the management information can extend to a region extending in the longitudinal direction of the lower layer film region 36.

By setting the length extending in the width direction of the fourth metal film 34 to be shorter than that of the third metal film 33, so as to allow the third metal film 33 to project in the longitudinal direction to have the second L-shape structure, the information appending region 39 is accommodated within the third metal film 33 while achieving the small outer shape of the submount 30.

The information appending region 39 can be provided in the fourth metal film 34 by, for example: reducing the side extending in the width direction of the third metal film 33; elongating the fourth metal film 34 to extend further than the third metal film 33 in the width direction; and allowing the extending portion to approach toward the first metal film 31 or the second metal film 32.

In the first metal film 31 or the upper metal layer 37 of the first metal film 31, a line (i.e., a phantom line ML1) passing through the midpoint of the side defining the width direction and perpendicular to the longitudinal direction intersects with the first metal film 31 and the third metal film 33 (see FIG. 6). Here, in the third metal film 33, the phantom line ML1 does not intersect with the upper metal layer 37, but intersects with the lower metal layer 35. Satisfying this relationship to form the metal films can achieve the small outer shape of the submount 30.

In the submount 30, in the second metal film 32 or the upper metal layer 37 of the second metal film 32, a line (a phantom line ML2) passing through the midpoint of the side in the width direction and parallel to the longitudinal direction intersects with the second metal film 32, the third metal film 33, and the fourth metal film 34 in sequence (see FIG. 6). Here, in the third metal film 33 and the fourth metal film 34, the phantom line ML2 does not intersect with the upper metal layer 37 and intersects with the lower metal layer 35. Satisfying this relationship to form the metal film can achieve the small outer shape of the submount 30.

The information appending region 39 intersects with the phantom line ML1. The information appending region 39 is provided on the first metal film 31 side with reference the phantom line ML2.

The insulating material of the main material of the submount 30 can be, for example, silicon nitride, aluminum nitride, or silicon carbide. In relation to the metal films, the lower metal layer 35 can be Ti/Pt/Au (layered in sequence of Ti, Pt, Au from the upper surface of the submount 30 downward) and the upper metal layer 37 can be Pt/AuSn. The materials of the metal films are not limited thereto.

The light-reflective member 40 includes a light-reflective surface 41 which is inclined relative to the lower surface. The light-reflective surface 41 is flat, and designed to form an angle of 45 degrees relative to the lower surface. This angle is not limited to 45 degrees. The light-reflective surface 41 can be a curved surface.

The main material of the light-reflective member 40 can be glass, metal or the like. The main material is preferably heat resistant, and can be, for example, quartz or glass such as BK7 (borosilicate glass), metal such as Al, or Si. As the light-reflective surface 41, metal such as Ag, Al or a dielectric multilayer film of $Ta_2O_5/SiO_2$, $TiO_2/SiO_2$, $Nb_2O_5/SiO_2$ can be used.

The light-reflective surface 41 can have a light reflectivity of 99% or more relative to the peak wavelength of laser light to be reflected. The light reflectivity may be 100% or less or less than 100%.

The protective elements 50 are provided to prevent breakage of specific elements (e.g., the semiconductor laser elements) by overcurrent. The protective elements 50 can be, for example, Zener diodes. The Zener diodes can be formed of Si. The wires 60 are, for example, metal wires.

The lid member 70 is formed in a rectangular parallelepiped shape. In the lid member 70, sides in height direction are the shortest. The main material of the lid member 70 is a light-transmissive material. The main material can be, for example, sapphire. Sapphire is relatively high in refractive index and also in strength. To the peripheral region of the lower surface of the lid member 70, a metal film is provided.

The lid member 70 can have an opaque region at part of the upper surface or the lower surface. For example, the lid member 70 can partially have a region highly reflective or light-cutting. The shape of the lid member 70 can be a rectangular parallelepiped. The main material of the lid member 70 can be glass or the like.

Next, a description will be given of the light emitting device 1 made up of the above-described element.

One or more protective elements 50 are disposed on one or more upper surfaces of the step part 16. In the light emitting device 1, one protective element 50 corresponds to one emitter and, therefore, the protective elements 50 are provided as many as the emitters. The protective elements 50 being disposed at regions other than the submount 30 can contribute to downsizing the submount 30. The protective element 50 can be disposed on regions in the recess part other than the upper surfaces of the step parts 16.

Next, three semiconductor laser elements 20 are disposed on the submount 30. The three semiconductor laser elements 20 are disposed on the upper layer film region 38 so that their electrode surfaces are joined to the upper metal layer 37 of the submount 30. Accordingly, the three semiconductor laser elements 20 are proximity to or adjacent to one another. Specifically, two first semiconductor laser elements 21 are mounted next to each other. Proximity to one of the first semiconductor laser elements 21, the second semiconductor laser element 24 is mounted. Accordingly, the submount 30 is a mount member on which the semiconductor laser elements 20 are mounted.

In the following, when it is desired to distinguish between the two first semiconductor laser elements 21 disposed on the submount 30, the first semiconductor laser element nearer to the second semiconductor laser element 24 is referred to as the near first semiconductor laser element 22 (example of the first semiconductor laser element), and the first semiconductor laser element farther from the second semiconductor laser element 24 is referred to as the far first semiconductor laser element 23 (example of the third semiconductor laser element).

The first semiconductor laser elements 21 are bonded in the junction-up configuration, and the second semiconductor laser element 24 is bonded in the junction-down configuration. In other words, in each first semiconductor laser element 21, the first surface 202 is mounted on the submount 30, and in the second semiconductor laser element 24, the second surface 203 is mounted on the submount 30.

The far first semiconductor laser element 23 is mounted by being joined to the upper metal layer 37 of the first metal film 31. The near first semiconductor laser element 22 is mounted by being joined to the upper metal layer 37 of the second metal film 32. The second semiconductor laser element 24 is mounted by being joined to the upper metal layers 37 of the third metal film 33 and that of the fourth metal film 34. One of the two electrode surfaces provided onto the second surface 203 of the second semiconductor laser element 24 is joined to the third metal film 33, and the other one is joined to the fourth metal film 34.

The metal films are conduction parts which electrically connect the semiconductor laser elements 20. The upper metal layers 37 form mounting regions 307 on which the semiconductor laser elements 20 are mounted. Accordingly, the upper layer film region 38 corresponds to the mounting region 307. To the lower metal layers 35, the wires 60 are joined. Accordingly, the lower layer film region 36 corresponds to wiring region 308 to which wiring for electrically connecting the semiconductor laser elements 20 is bonded. The conduction part includes the mounting region 307 and the wiring region 308.

Here, in relation to the semiconductor laser elements 20, the conduction parts are each classified by the unit relating to electrical connection of one semiconductor laser element. Accordingly, when the metal films are each classified by the unit of the conduction part, it can be said that the first metal film 31 forms one conduction part, the second metal film 32 form one conduction part, and the third metal film 33 and the fourth metal film 34 form one conduction part.

In the following description, in distinguishing the conduction parts, the mounting regions, and the wiring regions of respective semiconductor laser elements are distinguished in the manner similar to the semiconductor laser elements. For example, the conduction part corresponding to the first semiconductor laser element is referred to as the first conduction part. Also for example, the conduction part corresponding to the far first semiconductor laser element is referred to as the far first conduction part.

The second conduction part 304 including the third metal film 33 and the fourth metal film 34 has an L-shaped outer shape as a whole. The second conduction part 304 is provided so as to cover the first conduction part 301 from the outside. As seen in a top view, the second conduction part 304 is greater in area than any of the near first conduction part 302 (example of the first conduction part) and the far first conduction part 303 (example of the third conduction part). The far first conduction part 303 is arranged adjacent to the near first conduction part 302 such that the near first mounting region 307 of the near first conduction part 302 is arranged between the far first mounting region 308 of the far first conduction part 303 and the second mounting region 308 of the second conduction part 304.

The second conduction part 304 includes two regions spaced apart from each other having an insulating material interposed between them inside the L-shaped outer shape. These two regions respectively correspond to the third metal film 33 and the fourth metal film 34. As used herein, the region related to electric connection with one emitter (i.e., a first emitter) is referred to as the first portion 305, and the region related to electric connection with other emitter (i.e., a second emitter) is referred to as the second portion 306.

Accordingly, it can be said that the second conduction part 304 includes a second mounting region 307 and a second wiring region 308 in each of the first portion 305 and the second portion 306. The electrode surface corresponding to the first emitter of the second semiconductor laser element 24 is bonded to the second mounting region 307 of the first portion 305, and the electrode surfaces corresponding to the second emitter is bonded to the second mounting region 307 of the second portion 306.

The long side of the second semiconductor laser element 24 is longer than that of the first semiconductor laser element 21. Accordingly, as to the mounting regions 307 also, the long side of the second mounting region 307 is longer than that of the first mounting region 307. This configuration may enhance bondability of the second mounting region with the semiconductor laser elements. This configuration can also contribute to improving evenness of the current distribution in the active layer of the semiconductor laser elements (see FIG. 9).

The three semiconductor laser elements 20 are disposed such that their respective light emission end surfaces 201 are arranged in the vicinity of one lateral surface of the submount 30 where ends of the mounting regions 307 are juxtaposed to one another. Accordingly, this lateral surface or the side corresponding to this lateral surface as seen in a top view is referred to as the light-emission-side lateral surface or the light-emission-side side. The three semiconductor laser elements 20 each emit light in the direction from a light-emission side lateral surface 309 of the submount 30 to the outside of the submount 30 (see FIG. 9).

The three semiconductor laser elements 20 are each disposed so that the minor-axis direction of the oval shape of the FFP in laser light emitted from the light emission end surface 201 becomes parallel to the upper surface of the submount 30, and the major-axis direction becomes perpendicular to the upper surface of the submount 30. As used herein, being "parallel" and "perpendicular" allows a difference of 5 degrees.

The three semiconductor laser elements 20 are disposed so that their light emission end surfaces 201 are provided on a plane identical to the light-emission-side lateral surface 309 of the submount 30. Alternatively, the emission end surfaces 201 project out from the light-emission-side lateral surface 309 of the submount 30. Note that, the emission end surface 201 may be positioned inner than the submount 30.

The light emission end surfaces 201 of the three semiconductor laser elements 20 are positioned in an identical plane. In this configuration, the optical path lengths of lights of the optical axes of respective three semiconductor laser elements 20 can be uniform at the timing in which the light output from the light emitting device 1.

As seen in a top view, the light emission end surfaces 201 of the first semiconductor laser elements 21 can be positioned within the first conduction parts 301 or the first mounting regions 307, while the light emission end surface 201 of the second semiconductor laser element 24 can be positioned on a plane including the lateral surface of the submount 30 or projects out from this plane. This configuration can inhibit light emitted by the light emission end surfaces 201 from irradiating the upper surface of the submount 30, and can provide improved stability and heat dissipation.

A supplementary description will be given of this point with reference to FIG. 12. FIG. 12 is a comparison of lights from two semiconductor laser elements 20 which are different from each other in the light emission position in the light emission end surface. In FIG. 12, one of the two semiconductor laser elements 20 of which emission position is nearer to a bonding surface BP exhibits a greater divergence of light in the vertical direction (i.e., the top-bottom direction). As can be seen from FIG. 12, as the emission position is nearer to the bonding surface BP, the distance traveled by light until reaching the bonding surface becomes shorter.

In the light emitting device 1, preferably the disposition position of the semiconductor laser elements is designed so as to prevent the upper surface of the submount 30 from being irradiated with light, taking into consideration of tolerance occur in mounting or the like. From this viewpoint, in the second semiconductor laser element 24 of which emission position is nearer to the upper surface of the submount 30, preferably the light emission end surface 201 is not on the inner side of the submount 30 as seen in a top view.

On the other hand, as the bonding area is greater, the bonding strength between the semiconductor laser elements and the submount 30 can be stable. Also, a greater bonding area improves heat dissipation effect. In each semiconductor laser element 20, the temperature becomes higher as nearer to the light emission end surface. From these viewpoints, the first semiconductor laser elements of which emission position is far from the upper surface of the submount 30 preferably have their light emission end surfaces 201 positioned inner than the submount 30 as seen in a top view, while preventing the upper surface of the submount 30 from being irradiated with emitted light.

When the semiconductor laser elements 20 are disposed on the submount 30, the following relationship is established between each semiconductor laser element 20 and the submount 30. As used herein, as seen in a top view, a direction parallel to the light emission end surface 201 of the semiconductor laser element 20 mounted on the submount 30 is referred to as the first direction, and a direction perpendicular to the light emission end surface 201 is referred to as the second direction.

The first conduction parts 301 are longer in the second direction than in the first direction. In relation to the second direction, the first wiring regions 308 extend further than the first mounting regions 307, in the direction from the emission end surface 201 toward the end surface (the lateral surface) opposite to the emission end surface 201.

In relation to the second direction, the second mounting regions 307 are longer than the first mounting regions 307. In relation to the second direction, the second mounting regions 307 extend further than the first mounting regions 307 or the first wiring regions 308 in the direction from the light emission end surface 201 toward the opposite end surface. Accordingly, in relation to the second direction, the second conduction part 304 or the second mounting region 307 extend further than the first conduction parts 301 in the direction from the light emission end surface 201 toward the opposite end surface.

In relation to the second direction, the first portion 305 and the second portion 306 of the second conduction part 304 extend further than the first conduction parts 301 in the direction from the light emission end surface 201 toward the opposite end surface. From the point where the first portion 305 and the second portion 306 extend further than the first conduction parts 301 in the second direction, they extend toward the first conduction parts 301 in the first direction. The second wiring region 308 in each of the first portion 305 and the second portion 306 is provided in this region extending toward the first conduction parts 301 in the first direction.

The second wiring region 308 in the first portion 305 is provided, in relation to the first direction, in a region extending toward the first conduction part 301 to reach the far first conduction part 303. This region is further provided in the direction extending from the light emission end surface 201 to the opposite end surface in the second direction.

The second wiring region 308 in the second portion 306 is provided in a region extending further than the second mounting region 307 in the direction from the light emitting end surface to the opposite end surface in the second direction. This region further extends toward the first conduction part 301 before the far first conduction part 303 in the first direction.

Accordingly, the second wiring region 308 of the first portion 305 extends toward the first conduction part 301 further than the second wiring region 308 of the second portion 306 in the first direction. The information appending region 39 is provided to a region extending further than the second portion 306.

As seen in a top view, the far first mounting region 307 (example of the third mounting region), the far first wiring region 308 (example of the third wiring region), the second wiring region 308 of the first portion 305 are arranged in this sequence on a phantom line running along the second direction and passing through the midpoint of the emission end surface 201 of the far first semiconductor laser element 23 disposed in the far first conduction part 303.

As seen in a top view, the near first mounting region 307, the near first wiring region 308, the second wiring region 308 of the first portion 305, and the second wiring region 308 of the second portion 306 are arranged in this sequence on a phantom line running along the second direction and passing through the midpoint of the light emission end surface 201 of the first semiconductor laser element 23 disposed in the near first conduction part 302. In other words, the near first mounting region 307, the near first wiring region 308, and the second wiring region 308 are arranged on the phantom line running along the second direction and passing through a center of the light emission end surface of the first semiconductor laser element 23 as seen in the top view with the near first wiring region 308 being arranged between the near first mounting region 307 and the second wiring region 308.

Accordingly, it can be said that the first mounting region 307, the first wiring region 308, and the second wiring region 308 are arranged in this sequence on the phantom line running along the second direction and passing through the midpoint of the light emission end surface 201 of the first semiconductor laser element 23 disposed in the first conduction part 301 and running from the light emission end surface 201 toward the opposite end surface passes through.

By the semiconductor laser elements 20 being mounted on the submount 30, the light emission position of the semiconductor laser elements 20 is adjusted upward. That is, the submount 30 is an adjusting member which adjusts the light emission position.

Subsequently, the submount 30 on which the semiconductor laser elements 20 are disposed is disposed on the bottom surface 12 of the basal part 10. The submount 30 is disposed on the bottom surface 12 inner than the frame formed by the frame part of the basal part 10. The submount 30 is disposed on the bottom surface 12 on the inner side relative to the step parts 16 of the basal part 10. As compared to a configuration in which a plurality of semiconductor laser elements 20 is respectively mounted on a plurality of submounts 30, the number of the submount 30 disposed on the bottom surface can be reduced and, therefore, the mounting can be simplified. The relative positional precision among the plurality of semiconductor laser elements 20 improves.

Subsequently, the light-reflective member 40 is disposed on the bottom surface 12 of the basal part 10. The light-reflective member 40 reflects lights emitted from the three semiconductor laser elements 20. Accordingly, the light-reflective surface 41 is oriented toward the light emission end surfaces 201. As seen in a top view, a side forming an upper edge 42 and a side forming a lower edge 43 of the inclined light-reflective surface 41, and the light-emission-side lateral surface 309 of the submount 30 are parallel to each other. The sides forming an upper edge 42 and a lower edge 43 of the inclined light-reflective surface 41, and the upper surface of the submount 30 are parallel to each other.

FIGS. 9 and 11 are each an enlarged view of the portion where the semiconductor laser elements 20 and the light-reflective member 40 are mounted. FIG. 9 shows the light emission positions of the semiconductor laser elements 20, and FIG. 11 shows the positions where the light-reflective surface 41 is irradiated with lights of the optical axes. The broken-line arrows respectively represent light of the optical axes, and the points EP represent the emission positions. The broken lines HL and LL are contour lines with reference to the bottom surface. The broken line HL is at a position higher than the broken line LL.

In the light emitting device 1, lights of the optical axes propagate in parallel to the upper surface of the submount 30, and is reflected by the light-reflective surface 41, whereby the lights of the optical axes propagate upwardly perpendicular to the bottom surface. As used herein, being "perpendicular" allows a difference of 5 degrees. The lights of the optical axes do not necessarily propagate upwardly perpendicular.

The emission position EP of the second semiconductor laser element 24 is positioned near to the upper surface of the submount 30. Therefore, the thickness of the submount 30 from its lower surface to its upper surface, or the height of the submount 30 from the bottom surface of the basal part 10 to the upper surface of the submount 30 is greater than the height from the bottom surface of the basal part 10 to the lower edge 43 of the light-reflective surface 41. Thus, the emission position EP of every semiconductor laser element 20 can be positioned higher than the lower edge 43 of the light-reflective surface 41.

In relation to the emission positions EP, the position at the light-reflective surface 41 where light of the optical axis from the second semiconductor laser element 24 irradiates, is lower than that from the first semiconductor laser elements 21. In the light emitting device 1, the second semiconductor laser element 24 is greater than the first semiconductor laser elements 21 in divergence angle in the vertical direction, in other words, the top-bottom direction with reference to the upper surface and the lower surface of the light emitting device 1. Therefore, setting the emission positions in this manner can allow lights to be efficiently incident on the light-reflective surface 41.

That is, when lights are emitted from the same height, the emission region of light of the second semiconductor laser element 24 with great divergence angle spreads higher than that of the first semiconductor laser elements 21 does. By setting the light emission position EP of the second semiconductor laser element 24 lower than the light emission positions EP of the first semiconductor laser elements 21, height to the upper edge 42 of the light-reflective surface 41 is increased, to thereby allow light to efficiently be incident on the light-reflective surface 41. This can also contribute to downsizing the light emitting device 1.

Accordingly, the first semiconductor laser elements 21 are each mounted in a junction-up configuration having the first surface 202 bonded to the upper surface of the submount 30, and the second semiconductor laser element 24 is mounted in a junction-down configuration having the second surface 203 bonded to the upper surface of the submount 30.

In allowing lights to efficiently be incident on the light-reflective surface 41, a proper range of the difference in vertical-direction divergence or top-bottom direction divergence of lights emitted from the first semiconductor laser elements 21 and the second semiconductor laser element 24 also depends on the divergence of the FFP of the semiconductor laser elements 20.

For example, in the light emitting device 1, the difference in divergence angles is preferably in a range of 3 degrees to 40 degrees, more preferably 3 degrees to 20 degrees, and further preferably 5 degrees to 10 degrees. An excessively great difference in divergence angles increases the amount of light failing to become incident on the light-reflective surface. A smaller difference in divergence reduces loss of light provided that the height of the emission positions is uniform.

Instead of a single light-reflective member 40 reflecting lights from all the semiconductor laser elements 20, a plurality of the light-reflective member 40 (e.g., the first, second and third light-reflective members) can be respectively disposed for the semiconductor laser elements, so that each light-reflective member 40 reflects light from corresponding one of the semiconductor laser elements.

Subsequently, in order to electrically connect the semiconductor laser elements 20, a plurality of wires 60 is connected. The wires 60 have their one ends bonded to the upper surfaces of the semiconductor laser elements or to the wiring regions 308 of the submount 30, and have their other ends bonded to the upper surfaces of the step parts.

In each first semiconductor laser element 21, the upper surface (i.e., the second surface 203) is provided with electrode surfaces respectively corresponding to the two emitters. Accordingly, one ends of two wires 60 are respectively bonded to the electrode surfaces of the emitters of the first semiconductor laser element, and one of the ends of the wires 60 is bonded to the first wiring region 308.

In the second semiconductor laser element 24, one end of one wire 60 is bonded to one electrode surface shared by two emitters of the second semiconductor laser element 24. One ends of two wires 60 are respectively bonded to the second wiring region 308 of the first portion 305 and the second wiring region 308 of the second portion 306. Accordingly, the wire 60 electrically connected to the first emitter is bonded to the wiring region 308 of the first portion 305, and the wire 60 electrically connected to the second emitter is bonded to the wiring region 308 of the second portion 306.

With the light emitting device 1, ON/OFF of light emission can be controlled for each emitter. ON/OFF of light emission can be controlled for each semiconductor laser element, that is, collectively controlled for multiple-emitters in one semiconductor laser element. The number of the wires 60 can be determined as appropriate according to the manner of control or the number of the semiconductor laser elements.

Subsequently, the lid member 70 is bonded to the upper surface of the basal part 10. By the metal films respectively provided onto the lid member 70 and the basal part 10 being bonded to each other via Au—Sn or the like, they are fixed to each other. The basal part 10 and the lid member 70 are bonded to each other so that the space where the semiconductor laser elements 20 are disposed becomes hermetically sealed closed space. Such hermetic sealing can reduce collection of organic substances or the like onto the light emission end surface 201 of each semiconductor laser element 20.

The lid member 70 functions as a light-transmissive member which transmits light reflected by the light-reflective surface 41 of the light-reflective member 40. As used herein, being "light transmissive" refers to exhibiting light transmittance of 80% or more.

Second Embodiment

Next, a description will be given of a light emitting device 2 according to a second embodiment. The light emitting device 2 is different from the light emitting device 1 according to the first embodiment in including two light-reflective members. The description of the first embodiment applies similarly to the light emitting device 2 according to the second embodiment other than any evident contradiction attributed to this difference. Therefore, the outer shape of the light emitting device 2 can be similar to that of the light emitting device 1 shown in FIGS. 1 and 2.

Figure 13:
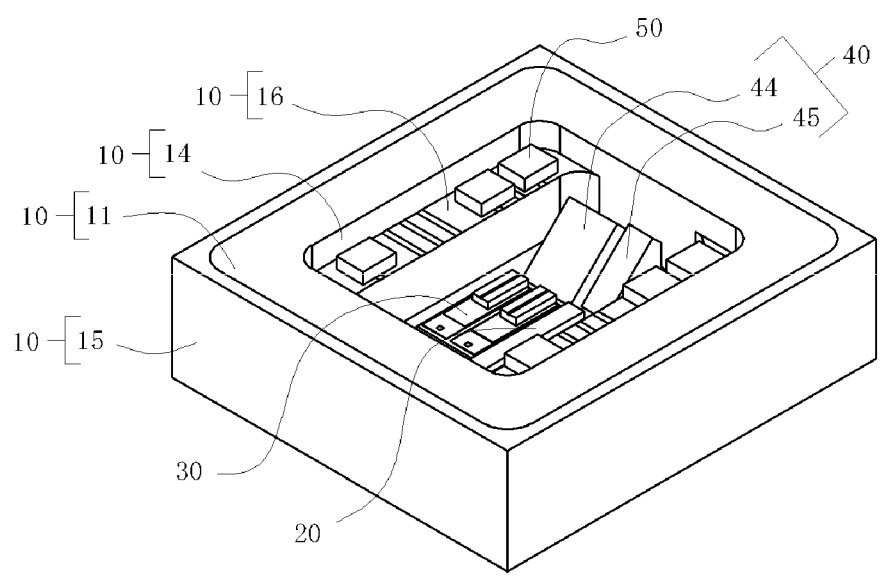
FIG. 13 is a perspective view for illustrating the constituent elements of the light emitting device according to a second embodiment.
Figure 14:
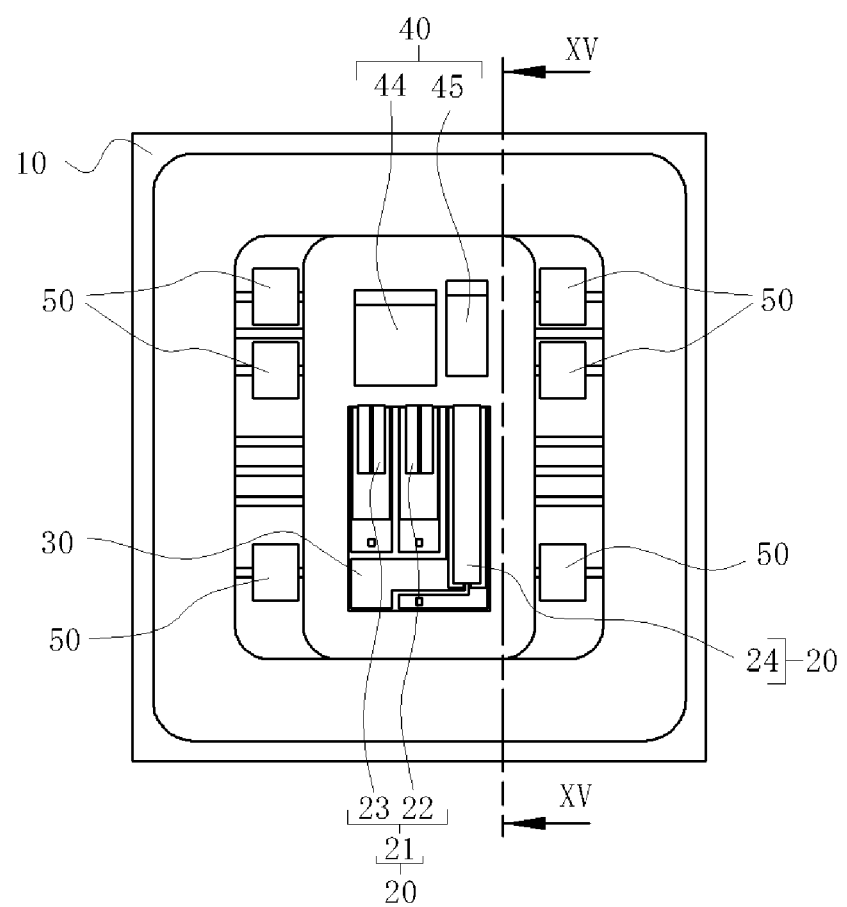
FIG. 14 is a top view for illustrating the constituent elements of the light emitting device according to the second embodiment.
Figure 15:
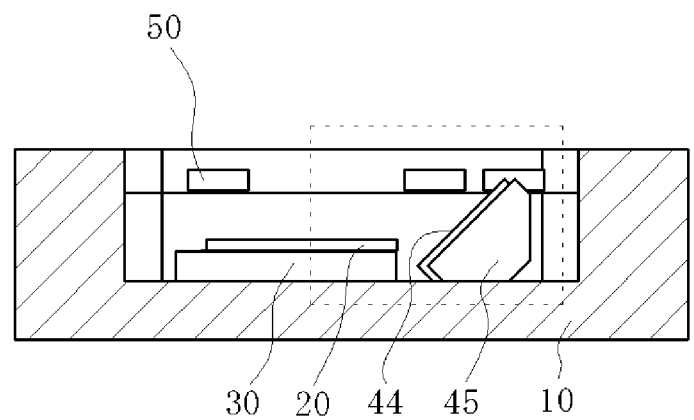
FIG. 15 is a cross-sectional view of the light emitting device taken along line XV-XV in FIG. 14.
Figure 16:
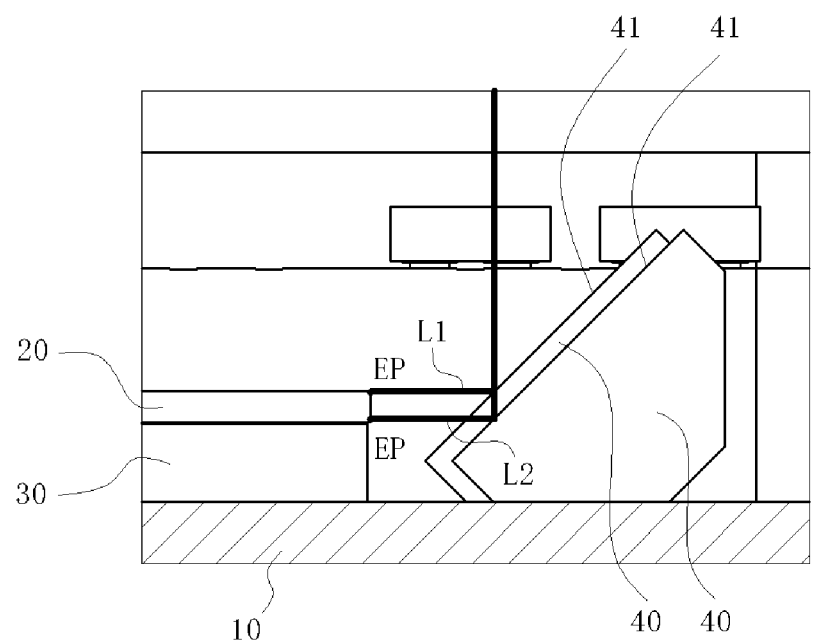
FIG. 16 is an enlarged view showing within the broken-line frame in FIG. 15 of the light emitting device according to the second embodiment.

FIG. 13 is a perspective view for illustrating the constituents of the light emitting device 2 excluding the lid member 70. FIG. 14 is a top view of the light emitting device 2 shown in FIG. 3. FIG. 15 is a cross-sectional view of the light emitting device 2 taken along line XV-XV in FIG. 14. FIG. 16 is an enlarged view of the region in the broken-line frame in FIG. 15.

In the light emitting device 1, the light emission end surfaces of the first semiconductor laser elements 21 and the second semiconductor laser element 24 are aligned so that lights respectively emitted from the first semiconductor laser elements 21 and the second semiconductor laser element 24 have the same optical path length at a point where light is output from the light emitting device 1, and the light is reflected by one light-reflective surface. On the other hand, because the height of the emission position EP is different, the positions where the lights of the optical axes reach the light-reflective surfaces are not uniform between the first semiconductor laser elements 21 and the second semiconductor laser element 24 as seen in a top view. In other words, the points of the light-reflective surface, where lights of the optical axes of the first semiconductor laser elements 21 and light of the optical axis of the second semiconductor laser element 24 reach, do not coincide with each other on a line perpendicular to the propagating direction of light of the optical axis as seen in a top view.

In the light emitting device 2, arrangement of the light-reflective members is adjusted so that lights of the optical axes respectively emitted by the first semiconductor laser elements 21 and the second semiconductor laser element 24 are aligned at the reached points in the light-reflective surfaces as seen in a top view. Specifically, a first light-reflective member 44 which is the light-reflective member 40 corresponding to the first semiconductor laser elements 21 and a second light-reflective member 45 which is the light-reflective member 40 corresponding to the second semiconductor laser element 24 are disposed at proper positions.

In the light emitting device 2, the light-reflective member 40 corresponding to the semiconductor laser element 20 which is greater in height from the bottom surface 12 to the light emission position EP is disposed closer to the light emission end surface than the light-reflective member 40 corresponding to the semiconductor laser element 20 which is smaller in height from the bottom surface to the light emission position EP.

In the light emitting device 2, the first semiconductor laser elements 21 correspond to the semiconductor laser elements 20 which are greater in height from the bottom surface 12 to the emission position EP, and the second semiconductor laser element 24 corresponds to the semiconductor laser element 20 of which height from the bottom surface 12 to the emission position EP is smaller. Because the difference in height influences the mounting orientation, their relative size relationship can be inverted.

The first light-reflective member 44 and the second light-reflective member 45 are disposed so that the positions in the light-reflective surfaces, where lights of the optical axes respectively emitted by the first semiconductor laser elements 21 and the second semiconductor laser element 24 irradiate, coincide with each other on a line perpendicular to the propagating direction of lights of the optical axes as seen in a top view.

As shown in FIGS. 15 and 16, at the height of the higher emission position EP, the light-reflective surface 41 of the light-reflective member 40 corresponding to the semiconductor laser element 20 emitting light at the higher emission position EP is disposed closer to the light emission end surface than the light-reflective surface 41 of the light-reflective member 40 corresponding to the semiconductor laser element 20 emitting light at the lower emission position EP.

At the height of the lower emission position EP also, the light-reflective surface 41 of the light-reflective member 40 corresponding to the semiconductor laser elements 20 emitting lights at the higher emission position EP is disposed closer to the light emission end surface than the light-reflective surface 41 of the light-reflective member 40 corresponding to the semiconductor laser element 20 emitting light at the lower emission position EP.

As seen in a plan view perpendicularly to the bottom surface 12 and in parallel to the propagation direction of lights of the optical axes, lights L1 of the optical axes emitted from the semiconductor laser elements 20 with the higher emission position EP and a light L2 of the optical axis emitted from the semiconductor laser element 20 with the lower emission position EP coincide with each other by being reflected by the light-reflective members 40. This is not applicable to a portion of the light emitted at the lower emission position EP before reaching the higher light emission position EP (that is, such a portion of light does not coincide with other light).

In this manner, aligning the light emission positions may facilitate control of lights exiting from the light emitting device in which a plurality of semiconductor laser elements emits lights. For example, it might be desirable to align emission positions of a plurality of laser lights exiting from the light emitting device in optically controlling the plurality of lights using any optical component such as a lens.

While Japanese Patent Publication No. 2011-066064 discloses the embodiment in which a plurality of light emitting elements is mounted on one mount member, but not disclosed about emission positions of lights emitted from the light emitting elements or the relationship with a light-reflective member. The light emitting device 2 according to the second embodiment may control the propagation directions of lights reflected by the light-reflective members.

Third Embodiment

Next, a description will be given of a light emitting device 3 according to the third embodiment. The light emitting device 3 is different from the light emitting device 1 according to the first embodiment in the wiring pattern of the submount, and in that not only the second semiconductor laser element but also the first semiconductor laser elements are mounted in a junction-down configuration. The description of the first embodiment applies similarly to the light emitting device 3 according to the third embodiment other than any evident contradiction attributed to these differences. Therefore, the outer shape of the light emitting device 3 can be similar to that of the light emitting device 1 shown in FIGS. 1 and 2.

Figure 17:
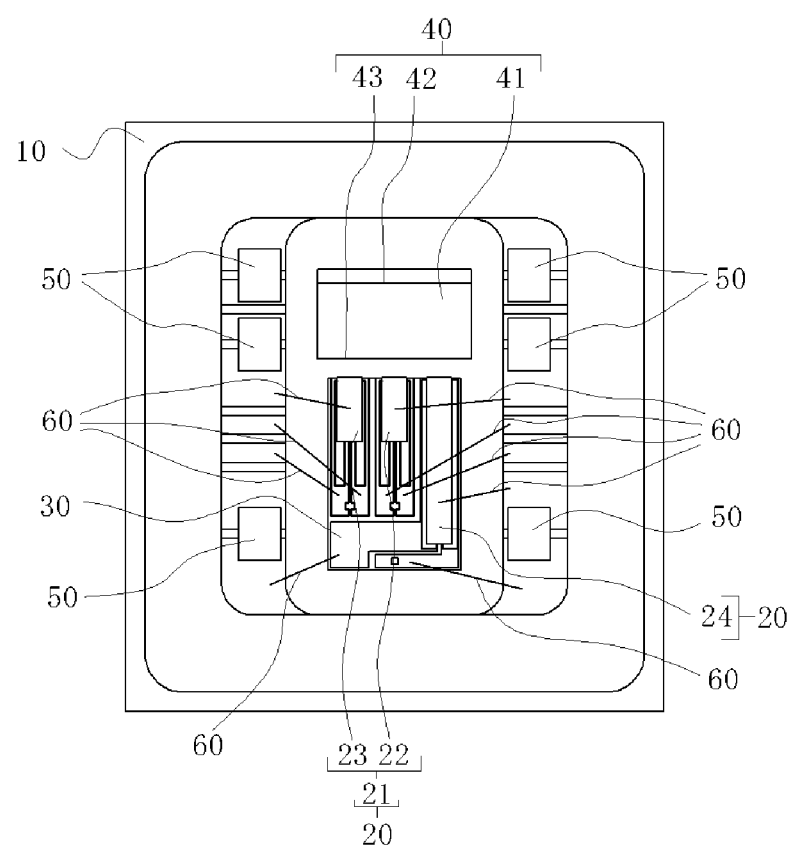
FIG. 17 is a top view for illustrating the constituent elements of a light emitting device according to a third embodiment.
Figure 18:
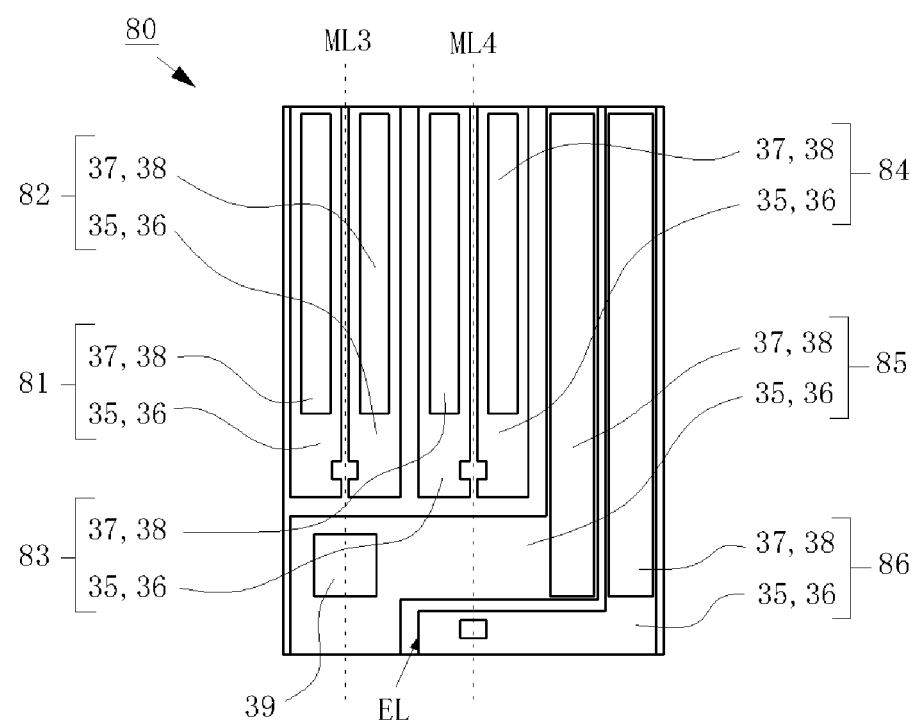
FIG. 18 is a top view of a submount of the light emitting device according to the third embodiment.
Figure 19:
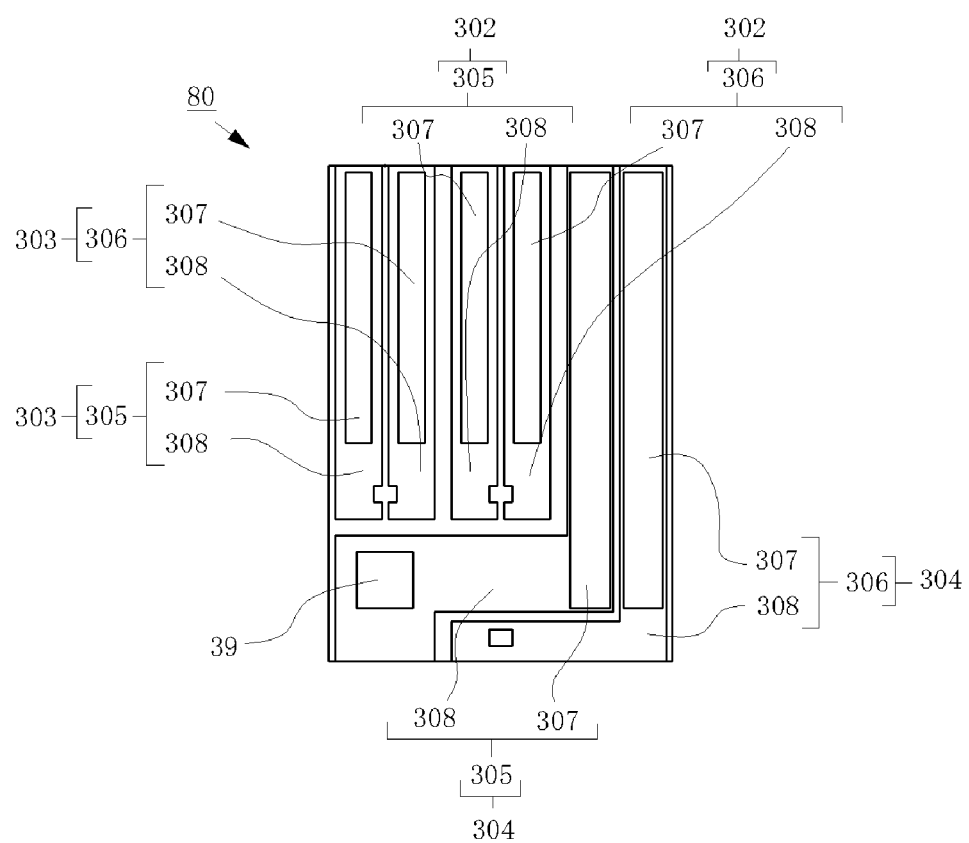
FIG. 19 is a top view of the submount of the light emitting device according to the third embodiment.

FIG. 17 is a top view for illustrating the constituent elements of the light emitting device 3 excluding the lid member 70. FIG. 18 is a top view of a submount 80 of the light emitting device 3. FIG. 19 is a top view of the submount for illustrating the relationship between the mounted semiconductor laser elements and the submount 30 in relation to the light emitting device 3.

The submount 80 includes the metal films greater number than the submount 30 according to the first embodiment and others. When it is desired to distinguish the metal films, they are distinguished from one another in the following manner: in the upper side in FIG. 18, a first metal film 81, a second metal film 82, a third metal film 83, a fourth metal film 84, a fifth metal film 85, and a sixth metal film 86, from the left in sequence.

The lower metal layer 35, the lower layer film region 36, the upper metal layer 37, and the upper layer film region 38 in the metal films and the information appending region 39 are similar to those according to the first embodiment. The first metal film 81 and the third metal film 83 have the same outer shape and the same size as seen in a top view. The second metal film 82 and the fourth metal film 84 have the same outer shape and the same size as seen in a top view. The outer shape of the first, second third and fourth metal layers each has a rectangle outer shape which is partially recessed. The recess is small relative to the whole metal film.

The recess in each of the first metal film 81 to the fourth metal film 84 configures as part of the outer shape of the lower layer film region 36, but does not configure as the outer shape of the upper metal layer 37. The recesses are formed at the same position in the longitudinal direction and oppose to each other between the first metal film 81 and the second metal film 82 and between the third metal film 83 and the fourth metal film 84.

The upper layer film regions 38 of the first metal film 81 to the fourth metal film 84 have the same outer shape and the same size as seen in a top view. As used herein, having the "same size" allows a difference in area of 20% or less. The fifth metal film 85 and the sixth metal film 86 respectively correspond to the third metal film 33 and the fourth metal film 34 according to the first embodiment.

In each of the first metal film 81 to the sixth metal film 86, the long sides of the upper layer film region 38 are parallel to each other. Accordingly, in each of the first metal film 81 to the sixth metal film 86, the short sides are also parallel to each other. As used herein, being parallel allows a difference of 3 degrees. The first metal film 81 to the sixth metal film 86 have the same length in the width direction. As used herein, being the "same" allows a difference of 20% or less.

With respect to the length in the longitudinal direction, each of the upper layer film regions 38 of the fifth metal film 85 or the sixth metal film 86 is greater than each of the upper layer film regions 38 of the first metal film 81 to the fourth metal film 84. Specifically, for example, each of the upper layer film regions 38 of the fifth metal film 85 or the sixth metal film 86 is greater than each of the upper layer film regions 38 of the first metal film 81 to the fourth metal film 84 by more than 20%. With respect to the length in the longitudinal direction, each of the upper layer film regions 38 of the fifth metal film 85 or the sixth metal film 86 is greater than each of the first metal film 81 to the fourth metal film 84.

A phantom line ML3 passing between the first metal film 81 and the second metal film 82 and parallel to the longitudinal direction intersects with the fifth metal film 85. This phantom line ML3 does not intersect with other metal films. The phantom line ML3 does not intersect with the upper metal layer 37 of the fifth metal film 85 but with the lower metal layer 35.

The fifth metal film 85 and the sixth metal film 86 are arranged in this sequence from the third metal film 83 side or the fourth metal film 84 side so as to intersect with a phantom line ML4 passing between the third metal film 83 and the fourth metal film 84 and parallel to the longitudinal direction. In this situation, the line does not intersect with metal films on any upper metal layer 37, but intersects with some of the lower metal layers 35. The information appending region 39 intersects with the phantom line ML3. With reference to the phantom line ML4, the information appending region 39 is provided on the first metal film 81 side.

In the light emitting device 3 including such a submount 80 as its constituent element, both the first semiconductor laser elements 21 and the second semiconductor laser element 24 are mounted to the submount 80 in a junction-down configuration.

The far first semiconductor laser element 23 is mounted by being bonded to the upper metal layers 37 of the first metal film 81 and the second metal film 82, and the near first semiconductor laser element 22 is mounted by being bonded to the upper metal layers 37 of the third metal film 83 and the fourth metal film 84. The second semiconductor laser element 24 is mounted by being bonded to the upper metal layers 37 of the fifth metal film 85 and the sixth metal film 86.

In the submount 80, not only the second conduction part 304 but also the near first conduction part 302 and the far first conduction part 303 have the first portion 305 and the second portion 306. The first metal film 81 corresponds to the first portion 305 of the far first conduction part 303, and the second metal film 82 corresponds to the second portion 306 of the far first conduction part 303. The third metal film 83 corresponds to the first portion 305 of the near first conduction part 302, and the fourth metal film 84 corresponds to the second portion 306 of the near first conduction part 302. The fifth metal film 85 corresponds to the first portion 305 of the second conduction part 304, and the sixth metal film 86 corresponds to the second portion 306 of the second conduction part 304.

The first conduction parts 301 each form an alignment mark by their respective recesses opposing to each other in the first portion 305 and the second portion 306. Using this alignment mark, each first semiconductor laser element 21 may be precisely mounted on the submount 80.

When the first semiconductor laser elements 21 and the second semiconductor laser element 24 are bonded in a junction-down configuration, the emission position EP may fail to be aligned between the first semiconductor laser elements 21 and the second semiconductor laser element 24.

For example, when the first semiconductor laser elements 21 and the second semiconductor laser element 24 are largely different in size, this may result in a difference in height. For example, a difference in semiconductor materials used may also result in a difference in height. Alternatively, when the first semiconductor laser elements 21 and the second semiconductor laser element 24 are manufactured by different manufacturers, this may also result in a difference in height. This is caused, for example, by a difference in thickness of the plating on the bonding surface of the semiconductor laser elements.

As described above, when the height from the second surface of the semiconductor laser element 20 to the emission position EP is different between the first semiconductor laser elements 21 and the second semiconductor laser element 24, the height from the lower surface of the submount 80 to the mounting region 307 of the first conduction part 301 and the height from the lower surface of the submount 80 to the mounting region 307 of the second conduction part 304 can be made different from each other, so as to provide uniform height of the emission position EP from the lower surface of the submount 80 or uniform height from the bottom surface 12 of the basal part 10.

For example, when the height from the second surface of the first semiconductor laser elements 21 to the emission position EP is lower than the height from the second surface of the second semiconductor laser element 24 to the emission position EP, the submount 80 is formed so that the thickness of the mounting region 307 of the first conduction part 301 becomes greater than the thickness of the mounting region 307 of the second conduction part 304 by the difference.

Furthermore, for example, when the height from the second surface of the first semiconductor laser elements 21 to the emission position EP is higher than the height from the second surface of the second semiconductor laser element 24 to the emission position EP, the submount 80 is formed so that the thickness of the mounting region 307 of the second conduction part 304 becomes greater than the thickness of the mounting region 307 of the first conduction part 301 by the difference.

In this manner, the height of each mounting region in the submount 80 can be adjusted according to the emission position EP of the semiconductor laser elements 20 mounted thereon. Accordingly, the light emission positions EP from the light emitting device can be uniform by using one light-reflective member 40.

That is, in order to align the light emission positions EP from the light emitting device, a plurality of light-reflective members is disposed corresponding to the difference in height between the emission positions EP, in the second embodiment. In the present embodiment, one light-reflective member is disposed, and the thickness of each conduction part in the submount is adjusted. Thus, similarly to the second embodiment, the light emitting device according to the third embodiment may control the propagation directions of lights reflected by the reflecting member.

In the light emitting device 3, the first semiconductor laser element 21 and the second semiconductor laser element 24 are bonded in a junction-down configuration and, therefore, the wires 60 are connected according to this configuration. That is, in each first semiconductor laser element 21 also, one end of one wire 60 is bonded to one electrode surface shared by two emitters of the first semiconductor laser element 21, and one ends of two wires 60 are respectively bonded to the first wiring region 308 of the first portion 305 and the first wiring region 308 of the second portion 306. Accordingly, the wire 60 electrically connected to the first emitter is bonded to the wiring region 308 of the first portion 305, and the wire 60 electrically connected to the second emitter is bonded to the wiring region 308 of the second portion 306.

In the foregoing, the light emitting device of the present disclosure has been described in the first embodiment to the third embodiment. Based on each of the embodiments, a light emitting device can be realized by integrating technical ideas disclosed in different embodiments. For example, in the light emitting device according to the third embodiment, a plurality of light-reflective members can be disposed as disclosed in the second embodiment. The disclosure by the embodiments also covers any light emitting device realized by such an integration.

Although the light emitting device according to each of the embodiments has been described, the light emitting device of the present disclosure is not strictly limited to the light emitting device according to each of the embodiments. That is, the present disclosure can be realized without being limited to the outer shape or configuration of the light emitting device disclosed by the embodiments. Not all the constituents are essential in realizing the present disclosure. For example, when the scope of claims does not recite part of the constituents of the light emitting device, a person skilled in the art can replace, omit, deform, or change the material of such part of the constituents. Thus, flexibility in design as to such part is allowed, in conjunction with the inventive aspects recited in the scope of claims.

The light emitting device according to each of the embodiments is applicable to a head-mounted display, a projector, a vehicle headlight, illumination, a display and the like.

What is claimed is:

1. A light emitting device comprising:
   a first semiconductor laser element configured to emit light in a prescribed direction;
   a second semiconductor laser element configured to emit light in the prescribed direction;
   a first light-reflective member spaced apart from the first semiconductor laser element in the prescribed direction, the first light-reflective member having a first lower surface and a first light-reflective surface inclined relative to the first lower surface, the first light-reflective surface being configured to reflect the light emitted from the first light-reflective member;
   a second light-reflective member spaced apart from the second semiconductor laser element in the prescribed direction, the second light-reflective member having a second lower surface and a second light-reflective surface inclined relative to the second lower surface, the second light-reflective surface being configured to reflect the light emitted from the second light-reflective member; and
   a basal part having a bottom surface over which the first semiconductor laser element, the second semiconductor laser element, the first light-reflective member and the second light-reflective member are disposed,
   wherein
   the first lower surface of the first light-reflective member faces the bottom surface of the basal part,
   the second lower surface of the second light-reflective member faces the bottom surface of the basal part,
   the light emitted from the first semiconductor laser element and traveling along an optical axis irradiates the first light-reflective surface at a first position,
   the light emitted from the second semiconductor laser element and traveling along an optical axis irradiates the second light-reflective surface at a second position,
   a height from the first lower surface of the first light-reflective member to the first position on the first light-reflective surface is different from a height from the second lower surface of the second light-reflective member to the second position on the second light-reflective surface as measured along a direction perpendicular to the bottom surface of the basal part, and
   with respect to the prescribed direction, a difference between the first position and the second position is smaller than a difference between a mounting position of the first light-reflective member and a mounting position of the second light-reflective member.

2. The light emitting device according to claim 1, further comprising
   a third semiconductor laser element configured to emit light in the prescribed direction, wherein
   the light emitted from the third semiconductor laser element and traveling along an optical axis irradiates the first light-reflective surface at a third position, and
   the height from the first lower surface of the first light-reflective member to the first position on the first light-reflective surface is the same as a height from the first lower surface of the first light-reflective member to the third position on the first light-reflective surface as measured along the direction perpendicular to the bottom surface of the basal part.

3. The light emitting device according to claim 1, further comprising:
   a third semiconductor laser element configured to emit light in the prescribed direction; and
   a third light-reflective member spaced apart from the third semiconductor laser element in the prescribed direction, the third light-reflective member having a third lower surface and a third light-reflective surface inclined relative to the third lower surface, the third light-reflective surface being configured to reflect the light emitted from the third light-reflective member, wherein
   the third light-reflective member is integrally formed with the first light-reflective member, or separated from the first light-reflective member,
   the third lower surface of the third light-reflective member facing the bottom surface of the basal part,
   the light emitted from the third semiconductor laser element and traveling along an optical axis irradiates the third light-reflective surface at a third position, and
   the height from the first lower surface of the first light-reflective member to the first position on the first light-reflective surface is the same as a height from the third lower surface of the third light-reflective member to the third position on the third light-reflective surface as measured along the direction perpendicular to the bottom surface of the basal part.

4. The light emitting device according to claim 1, wherein
the first semiconductor laser element has a first lower surface and a first light emission end surface from which the light is configured to be emitted,
the second semiconductor laser element has a second lower surface and a second light emission end surface from which the light is configured to be emitted, and
a height from the first lower surface of the first semiconductor laser element to an emission position on the first light emission end surface of the first semiconductor laser element is different from a height from the second lower surface of the second semiconductor laser element to an emission position on the second light emission end surface of the second semiconductor laser element.

5. The light emitting device according to claim 1, wherein
the first semiconductor laser element has a first upper surface, a first lower surface and a first light emission end surface from which the light is configured to be emitted,
the second semiconductor laser element has a second upper surface, a second lower surface and a second light emission end surface from which the light is configured to be emitted,
the second semiconductor laser element has a greater vertical-direction divergence than the first semiconductor laser element, and
an emission position on the second light emission end surface of the second semiconductor laser element is disposed closer to the second lower surface than to the second upper surface.

6. The light emitting device according to claim 5, wherein
an emission position on the first light emission end surface of the first semiconductor laser element is disposed closer to the first upper surface than to the first lower surface.

7. The light emitting device according to claim 1, further comprising
a lid member bonded to the basal part to form a hermetically sealed closed space, wherein
the first semiconductor laser element and the second semiconductor laser element are arranged in the hermetically sealed closed space.

8. The light emitting device according to claim 1, further comprising
a submount on which the first semiconductor laser element and the second semiconductor laser element are mounted, wherein
the first semiconductor laser element and the second semiconductor laser element are disposed over the bottom surface of the basal part via the submount.

\* \* \* \* \*